United States Patent

Kusumoto et al.

[11] Patent Number: 5,812,626
[45] Date of Patent: Sep. 22, 1998

[54] TIME COUNTING CIRCUIT SAMPLING CIRCUIT SKEW ADJUSTING CIRCUIT AND LOGIC ANALYZING CIRCUIT

[75] Inventors: Keiichi Kusumoto, Hyogo; Akira Matsuzawa, Kyoto, both of Japan

[73] Assignee: Matsushita Electric Industrial Co., Ltd., Osaka, Japan

[21] Appl. No.: 664,218

[22] Filed: Jun. 11, 1996

[30] Foreign Application Priority Data

Jun. 13, 1995 [JP] Japan .................................. 7-146095

[51] Int. Cl.[6] .................................................. G01R 29/02
[52] U.S. Cl. ............................... 327/20; 327/33; 327/271
[58] Field of Search .......................... 377/20, 24; 327/33, 327/271

[56] References Cited

U.S. PATENT DOCUMENTS 4,710,653  12/1987  Yee ............................................ 327/38
5,166,959  11/1992  Chu et al. ................................. 377/20

OTHER PUBLICATIONS

Technical Report of IEICE, "A Time–to–Digital Converter LSI", IDC 93–77, pp. 37–43, 1993–08.

Primary Examiner—Margaret Rose Wambach
Attorney, Agent, or Firm—McDermott, Will & Emery

[57] ABSTRACT

There is provided a time counting circuit which measures a pulse spacing of a pulse signal with a high accuracy and exhibits high resistance to variations in power-source voltage.

A delay circuit ring consists of a plurality of delay circuits connected in a ring configuration and signal transition is caused to circulate around the delay circuit ring by oscillation. A switch-signal generating circuit outputs first and second switch signals based on the time at which a pulse signal to be measured rises. A row of sampling circuits consists of a plurality of sampling circuits connected to the output terminals of the respective delay circuits and samples the output signals from the delay circuits in response to a direction indicated by the first switch signal. A row of holding circuits consists of a plurality of holding circuits connected to the output terminals of the respective sampling circuits and holds the output signals from the sampling circuits in response to a direction indicated by the second switch signal. An operating circuit calculates the pulse spacing of the pulse signal to be measured based on a logic level signal outputted from the row of holding circuits.

8 Claims, 23 Drawing Sheets

5,812,626

TIME COUNTING CIRCUIT SAMPLING CIRCUIT SKEW ADJUSTING CIRCUIT AND LOGIC ANALYZING CIRCUIT

RELATED APPLICATIONS

This application is related to co-pending application Ser. No. 08/624,960.

BACKGROUND OF THE INVENTION

The present invention relates to a time counting circuit for measuring such time as the pulse spacing of a pulse signal, to a sampling circuit for sampling a signal inputted from the outside and amplifying a differential voltage between the sampled signal and a reference potential, to a skew adjusting circuit for adjusting a skew between a plurality of clock pulse signals, and to a logic analyzing circuit for analyzing the logic of a signal.

There have been rising hopes for the use of time counting circuits for measuring such time as the pulse spacing of a pulse signal in the field of digital communication and the like. In recent years, it has become possible to mount a time counting circuit composed of a CMOS transistor in conjunction with other digital circuits on a single chip, which has accomplished a significant reduction in the cost of manufacturing semiconductor devices.

A time counting circuit which exhibits further stabilized operation with higher accuracy may also find extensive application in various fields including the modulation of FM signals and the demodulation of bus signals in an LSI. If a time counting circuit capable of measuring an extremely short time with accuracy and stability can be utilized for the demodulation of bus signals in an LSI, the number of buses in the LSI can be reduced significantly.

FIG. 21 shows an example of the structure of a conventional time counting circuit, in which are shown: a delay circuit ring 51; a row of holding circuits 54; an operating circuit 55; a counter 56a; and a counter-output holding circuit 56b. A pulse-signal input terminal receives a pulse signal to be measured and an operation-result output terminal outputs time data representing the pulse spacing of the inputted pulse signal to be measured.

The time counting circuit shown in FIG. 21 includes the delay circuit ring 51 composed of seven delay circuits each consisting of two inverters and one delay circuit consisting of three inverters (the eighth delay circuit in FIG. 21), which are connected in a ring configuration. Since the delay circuit ring 51 is composed of the odd number of (2×7+3=17) inverters, so-called oscillation is observed whereby one signal transition occurs after another as though seemingly moving along the delay circuit ring 51 with the passage of time, resulting in circulations around the delay circuit ring 51. Therefore, time can be measured by examining variations in the output voltages from the respective delay circuits.

The output signals from the respective delay circuits composing the delay circuit ring 51 are held in flip-flops (FFs) composing the row of holding circuits 54. When the pulse to be measured rises, it is outputted to the operating circuit 55. The counter 56a counts the number of circulations of signal transition around the delay circuit ring 51 and outputs the counted number of circulations to the operating circuit 55 via the counter-output holding circuit 56b. The operating circuit 55 converts signals outputted from the row of holding circuits 54 to numeric data, calculates the pulse spacing of the pulse signal to be measured, and outputs the operation result from an output terminal for operation result (see "Time-to-Digital Converter LSI" Technical Report of IEICE, ICD93-77 (1993-08)).

However, the conventional time counting circuit has the following disadvantages.

FIG. 22(a) is a graph showing the transitions of the output voltages from the respective delay circuits composing the delay circuit ring 51. In the drawing, the straight line 1 represents the transition of the output voltage from the 1st delay circuit. Likewise, the straight lines 2 to 7 represent the transitions of the output voltages from the 2nd to 7th delay circuits, respectively.

As will be understood from FIG. 22(a), to shift from VSS (the logic level "0") to VDD (the logic level "1"), the output voltage from each delay circuit requires a given period of time. This is because each delay circuit drives a load appearing at the input terminal of the subsequent delay circuit, i.e., an input capacitance. Therefore, the period of time required for shifting corresponds to a charging period during which the input terminal of the subsequent delay circuit is charged.

For example, when the output voltage from the 1st delay circuit initiates shifting from "0" to "1", the output voltage from the 2nd delay circuit initiates shifting from "0" to "1" after a given delay time. Subsequently, the 3rd delay circuit initiates shifting from "0" to "1" after a given delay time. In this manner, the output voltages from the individual delay circuits sequentially shift. It follows therefore that, at a given time in FIG. 22(a), output voltages from a plurality of delay circuits are shifting.

The operation of the flip-flops (FF) composing the row of holding circuits 54 are not in synchronization with the operation of the delay circuit ring 51. Hence, there may be cases where not only a voltage representing the so-called logic level "0" or "1" but also an intermediate voltage in the transition from "0" to "1" is inputted to the flip-flops. Since the flip-flop is a circuit for holding and outputting an input signal on either one of the logic levels "0" and "1", it changes the intermediate voltage to either one of the logic levels "0" and "1" and holds it. Accordingly, there is a range of input voltages in which an input signal may be held as either "0" or "1" in the flip-flop. The range of input voltages is termed an indefinite range.

It is assumed here that the pulse to be measured rises at the time T in FIG. 22(a). In this case, since each of the output voltage from the 1st delay circuit and the output voltage from the 2nd delay circuit is in the indefinite range, the 1st flip-flop has a probability A (0<A<1) of holding "0" and a probability B (0<B<1, B=1−A) of holding "1". The 2nd flip-flop has a probability C (0<C<1) of holding "0" and a probability D (0<D<1, D=1−C) of holding "1".

As long as a time counting circuit as shown in FIG. 21 is operating normally, the outputs from the 1st to 5th flip-flops sequentially change from "00000" to "10000" and from "10000" to "11000". At the time T, however, the 1st to 5th flip-flops have a probability A×D of outputting "01000". At this point, the operating circuit 55 cannot operate properly and produces an error, which phenomenon is termed a mishold in the row of holding circuits.

There are other cases where the transitions of the output voltages from the delay circuits become sluggish and the indefinite range is expanded under the influence of noise in a power-source voltage supplied to the delay circuits and flip-flops or the like. FIG. 22(b) is a graph showing the transitions of the output voltages from the individual delay circuits in such cases. It is assumed here that the pulse signal to be measured rises at the time Te in FIG. 22(b). In this case, since the output voltages from the 2nd to 5th delay circuits are in the indefinite range, the probability that the row of holding circuits incurs a mishold becomes higher and an error resulting from the mishold becomes larger than in the case of FIG. 22(a).

The conventional time counting circuit also has other disadvantages.

Since actual transistors manufactured in a semiconductor manufacturing process have varied performances, the respective threshold voltages of actual flip-flips vary as well.

FIG. 23(a) is a graph showing the transitions of the output voltages from the respective delay circuits composing the delay circuit ring 51. In the drawing, the straight line 1 represents the transition of the output voltage from the 1st delay circuit. Likewise, the straight lines 2 to 7 represent the transitions of the output voltages from the 2nd to 7th delay circuits. Each of the threshold voltages of the 1st and 3rd to 7th flip-flops is represented by Va, while the threshold voltage of the 2nd flip-flop is represented by Vb.

FIG. 23(b) is a graph showing changes in the time codes outputted from the respective flip-flops composing the row of holding circuits 54. In the drawing, the time interval (time code 1) between the time at which the output voltage from the 1st delay circuit reaches the threshold voltage Va of the 1st flip-flop and the time at which the output voltage from the 2nd delay circuit reaches the threshold voltage Vb of the 2nd flip-flop is represented by t1. On the other hand, the time interval (time code 2) between the time at which the output voltage from the 2nd delay circuit reaches the threshold voltage Vb of the 2nd flip-flop and the time at which the output voltage from the 3rd delay circuit reaches the threshold voltage Va of the 3rd flip-flop is represented by t2.

Since the threshold voltage Va of each of the 1st and 3rd flip-flops is different from the threshold voltage Vb of the 2nd flip-flop, the time interval t1 representing the time code 1 differs from the time interval t2 representing the time code 2. Consequently, the linearity of time data relative to real time deteriorates and the accuracy with which time is measured is lowered.

SUMMARY OF THE INVENTION

It is therefore an object of the present invention to provide a time counting circuit which measures a pulse spacing or the like of a pulse signal with a higher accuracy than has previously been achieved and exhibits higher resistance to variations in power-source voltage.

Another object of the present invention is to provide a sampling circuit used to implement the above time counting circuit.

Still another object of the present invention is to provide a skew adjusting circuit for adjusting a skew between a plurality of clock pulse signals and a logic analyzing circuit for analyzing the logic of a signal, each of which employs the same means as used to implement the above time counting circuit.

Specifically, the present invention provides a time counting circuit for measuring a pulse spacing of a pulse signal, comprising: a delay circuit ring composed of a plurality of delay circuits connected in a ring configuration around which signal transition circulates; converting means composed of a single converting circuit or a plurality of converting circuits receiving an output signal from at least one of the delay circuits composing the above delay circuit ring, each converting circuit converting and outputting the output signal received from the corresponding one of the delay circuits in accordance with a direction given based on at least either one of the time at which a pulse signal to be measured rises and the time at which the pulse signal to be measured falls; and an operating circuit for converting a logic level signal obtained based on the signal outputted from the above converting means to numeric data and calculating the pulse spacing of the above pulse signal to be measured based on the above numeric data, wherein the converting circuit composing the above converting means converts the output signal from the above delay circuit such that logic represented by the output signal received from the delay circuit coincides with logic represented by the logic level signal obtained based on the output signal from the converting circuit.

The present invention also provides a sampling circuit for sampling, upon receiving a direction signal, a signal received from the outside and holding the sampled signal, while amplifying a differential voltage between a potential of the sampled signal and a given reference potential, the above sampling circuit comprising: an external input terminal for receiving the signal from the outside; a first circuit for receiving the signal from the above external input terminal; a second circuit for receiving the signal outputted from the above first circuit; a first switching means provided between the above external input terminal and an input terminal of the above first circuit, the above first switching means being switched between a conductive state for connecting the above external input terminal to the input terminal of the above first circuit and a non-conductive state for disconnecting the above external input terminal from the input terminal of the above first circuit; and a second switching means provided between the input terminal of the above first circuit and an output terminal of the above second circuit, the above second switching means being switched between a conductive state for connecting the input terminal of the above first circuit to the output terminal of the above second circuit and a non-conductive state for disconnecting the input terminal of the above first circuit from the output terminal of the above second circuit, wherein the above first circuit comprises: a first capacitance having one terminal connected to the input terminal of the above first circuit; a first inverting amplifier circuit for inverting and amplifying a voltage at another terminal of the above first capacitance and outputting the inverted and amplified voltage to an output terminal of the above first circuit; and a third switching means provided between input and output terminals of the above first inverting amplifier circuit, the above third switching means being switched between a conductive state for connecting the input terminal of the above first inverting amplifier circuit to the output terminal thereof and a non-conductive state for disconnecting the input terminal of the above first inverting amplifier circuit from the output terminal thereof and the above second circuit comprises: a second capacitance having one terminal connected to an input terminal of the above second circuit; a second inverting amplifier circuit for inverting and amplifying a voltage at another terminal of the above second capacitance and outputting the inverted and amplified voltage to the output terminal of the above second circuit; and a fourth switching means provided between input and output terminals of the above second inverting amplifier circuit, the above fourth switching means being switched between a conductive state for connecting the input terminal of the above second inverting amplifier circuit to the output terminal thereof and a non-conductive state for disconnecting the input terminal of the above second inverting amplifier circuit from the output terminal thereof, wherein when there is no direction indicated by the above direction signal, the above first and third switching means are in the conductive states, while the above second and fourth switching means are in the non-conductive states, when there is the direction indicated by the above direction signal, the above first and third switching means are temporarily brought into the non-conductive states, while the above second and fourth switching means are brought into the conductive states, and then the above first and third switching means are brought again into the conductive states, while the above second and fourth switches are brought again into the non-conductive states.

The present invention also provides a skew adjusting circuit for adjusting a skew between a plurality of clock pulse signals, the above skew adjusting circuit comprising: a first delay circuit for delaying one of the clock pulse signals by a delay time determined in accordance with a direction indicated by a first control signal and outputting the delayed clock pulse signal as a first clock pulse signal; a second delay circuit for delaying another of the clock pulse signals by a delay time determined in accordance with a direction indicated by a second control signal and outputting the delayed clock pulse signal as a second clock pulse signal; a first logic analyzing circuit for receiving the first clock pulse signal outputted from the above first delay circuit and analyzing logic of the above first clock pulse signal at the time at which the second clock pulse signal outputted from the above second delay circuit rises; a second logic analyzing circuit for receiving the second clock pulse signal outputted from the above second delay circuit and analyzing logic of the above second clock pulse signal at the time at which the first clock pulse signal outputted from the above first delay circuit rises; and an operating circuit for determining precedency in time of the above first clock pulse signal or the above second clock pulse signal in accordance with the logic analyzed by the above first and second logic analyzing circuits and generating and outputting the above first and second control signals for determining delay times in the above first and second delay circuit such that a time difference between the above first clock pulse signal and the above second clock pulse signal is reduced, the above skew adjusting circuit outputting the above first and second clock pulse signals as clock pulse signals with an adjusted skew.

The present invention also provides a logic analyzing circuit for analyzing logic of a signal, comprising a converting circuit for amplifying, upon receiving a direction to analyze the logic of the signal, a differential voltage between a potential of the above signal at the time at which the direction is given and a first given potential, adding the amplified differential voltage to a second given potential, and outputting the sum of the amplified differential voltage and the second given potential, the above logic analyzing circuit analyzing the logic of the above signal based on the output potential from the above converting circuit.

BRIEF DESCRIPTION OF THE DRAWINGS

FIGS. 3 are graphs each showing the transition of the output voltage from the sampling circuit of FIGS. 2, of which

FIGS. 4 illustrate the operation of the sampling circuit in the time counting circuit according to the first embodiment of the present invention, of which

FIGS. 13 show delay circuits in the time counting circuit using the PLL, of which

FIGS. 15 are graphs showing the time-varying voltages of first and second clock pulse signals on the rising edges thereof, of which

FIGS. 23 illustrate the disadvantages of the conventional time counting circuit, of which

DETAILED DESCRIPTION OF THE INVENTION

Figure 1:
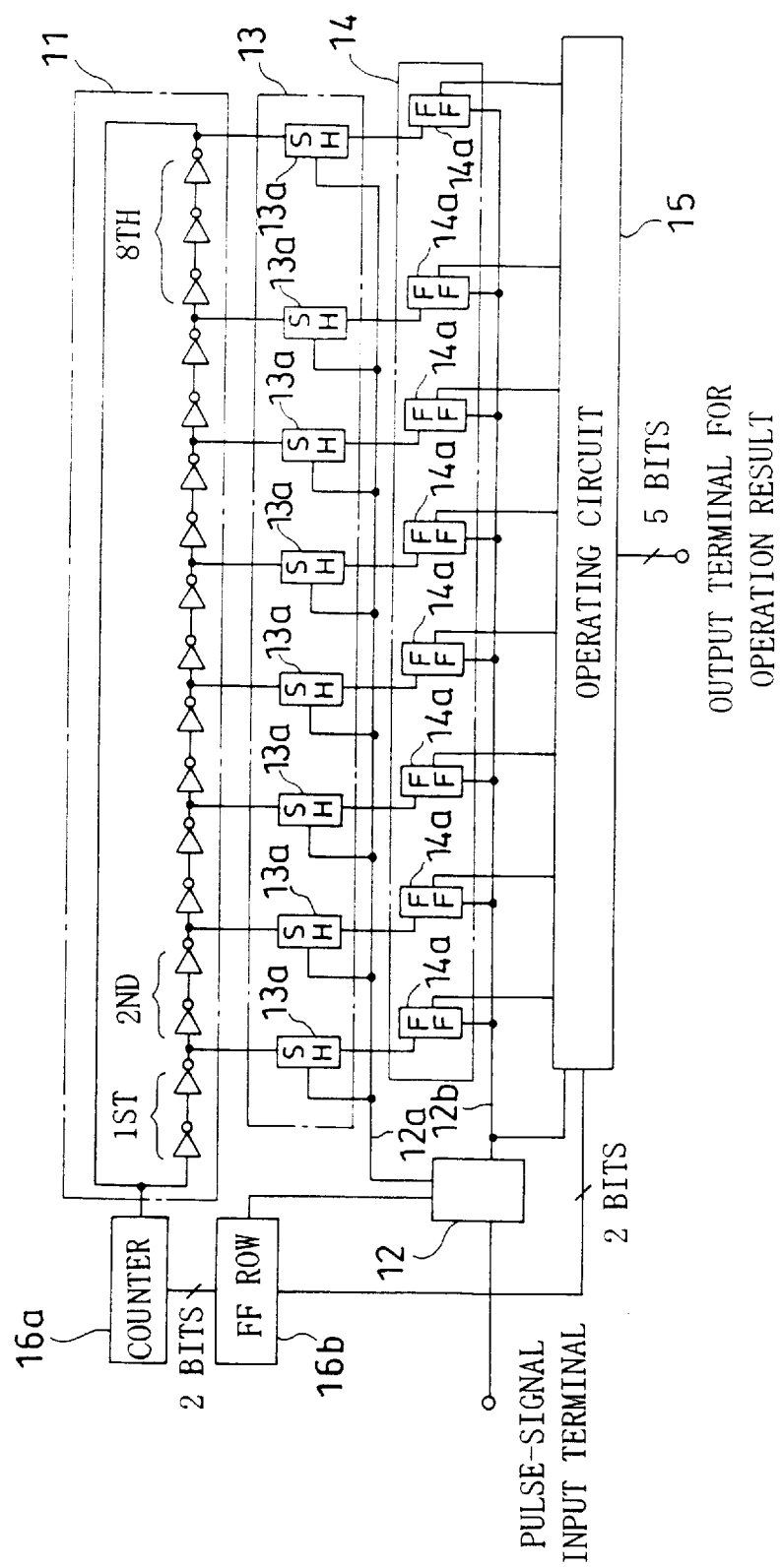
FIG. 1 shows the structure of a time counting circuit according to a first embodiment of the present invention.

FIG. 1 shows the structure of a time counting circuit according to a first embodiment of the present invention, in which are shown: a delay circuit ring 11; a switch-signal generating circuit 12; a row of sampling circuits 13 consisting of sampling circuits 13a as converting means; a row of holding circuits 14 consisting of flip-flops 14a as a holding circuit; an operating circuit 15; a counter 16a; and a counter-output holding circuit 16b. A pulse-signal input terminal receives a pulse signal to be measured. An output terminal for operation result outputs time data representing the pulse spacing of the pulse signal to be measured.

The delay circuit ring 11 consists of eight delay circuits connected in a ring configuration. Specifically, the 1st to 8th delay circuits are connected in series and the output terminal of the 8th delay circuit is connected to the input terminal of the 1st delay circuit. Each of the 1st to 7th delay circuits is composed of two inverters connected in series. The 8th delay circuit is composed of three inverters connected in series. In short, the delay circuit ring 11 is composed of 17 (=2×7+3) inverters connected in a ring configuration.

The switch-signal generating circuit 12 receives the pulse signal to be measured and outputs a first switch signal 12a to the row of sampling circuits 13 based on the timing with which the pulse signal to be measured rises. The switch-signal generating circuit 12 also outputs a second switch signal 12b to the row of holding circuits 14 based on the timing with which the pulse signal to be measured rises. The switch-signal generating circuit 12 also outputs a clock signal to the operating circuit 15 and to the counter-output holding circuit 16b based on the timing with which the pulse signal to be measured rises.

The row of sampling circuits 13 consists of the eight sampling circuits (SH) 13a as converting circuits connected to the output terminals of the respective delay circuits composing the delay circuit ring 11. Each of the sampling circuits 13a samples an output signal from the corresponding delay circuit in accordance with a direction indicated by the first switch signal 12a received from the switch-signal generating circuit 12.

The row of holding circuit 14 consists of the eight flip-flops (FFs) 14a as holding circuits connected to the output terminals of the respective sampling circuits 13a composing the row of sampling circuits 13. Each of the flip-flops 14a holds a signal outputted from the corresponding sampling circuit 13a and outputs the held signal upon receiving the second switch signal 12b from the switch-signal generating circuit 12. One sampling circuit 13a and the flip-flop 14a connected to the output terminal of the sampling circuit 13a constitute a logic analyzing circuit.

The counter 16a is connected to the output terminal of the 8th delay circuit (the input terminal of the 1st delay circuit) of the delay circuit ring 11 so as to count the number of circulations of signal transition around the delay circuit ring 11. The counter-output holding circuit 16b holds 2-bit count data outputted from the counter 16a and outputs the held count data upon receiving the clock signal from the switch-signal generating circuit 12.

The operating circuit 15 converts the signal outputted from the row of holding circuits 14 to numeric data, performs an operation with respect to the numeric data in conjunction with the count data outputted from the counter-output holding circuit 16b, and outputs 5-bit time data.

A detailed description will be given to the operation of the time counting circuit with reference to Table 1.

Since the delay circuit ring 11 consists of an odd number of (17) inverters connected in a ring configuration, so-called oscillation is observed whereby one, or transition signal, occurs after another as though seemingly moving along the delay circuit ring 11 with the passage of time, resulting in circulations around the delay circuit ring 11. Since each of the 1st to 7th delay circuits is composed of the two inverters, it outputs a signal representing the same logic level as that of the input signal after a given delay time. On the other hand, since the 8th delay circuit is composed of the three inverters, it outputs a signal representing the opposite logic level to that of the input signal after a given delay time. The inverters are so designed that delay times in the respective delay circuits become equal.

Table 1 shows the output signals from the respective delay circuits composing the delay circuit ring 11 varying with time and numeric data obtained when the pulse signal to be measured rises at different times. In Table 1, the HIGH and LOW levels of the output signals from the respective delay circuits are represented by "1" and "0", respectively. An increment of time represents a signal delay time in one delay circuit, which is assumed to be 1 ns.

TABLE 1

| TIME | OUTPUT FROM DELAY CIRCUIT RING | NUMERIC DATA |
| --- | --- | --- |
| 0 | 0 0 0 0 0 0 0 1 | 0 0 0 |
| 1 | 1 0 0 0 0 0 0 1 | 0 0 1 |
| 2 | 1 1 0 0 0 0 0 1 | 0 1 0 |
| 3 | 1 1 1 0 0 0 0 1 | 0 1 1 |
| 4 | 1 1 1 1 0 0 0 1 | 1 0 0 |
| 5 | 1 1 1 1 1 0 0 1 | 1 0 1 |
| 6 | 1 1 1 1 1 1 0 1 | 1 1 0 |
| 7 | 1 1 1 1 1 1 1 1 | 1 1 1 |
| 8 | 1 1 1 1 1 1 1 0 | 0 0 0 |
| 9 | 0 1 1 1 1 1 1 0 | 0 0 1 |
| 10 | 0 0 1 1 1 1 1 0 | 0 1 0 |
| 11 | 0 0 0 1 1 1 1 0 | 0 1 1 |
| 12 | 0 0 0 0 1 1 1 0 | 1 0 0 |
| 13 | 0 0 0 0 0 1 1 0 | 1 0 1 |
| 14 | 0 0 0 0 0 0 1 0 | 1 1 0 |
| 15 | 0 0 0 0 0 0 0 0 | 1 1 1 |

Here (TIME 0), it is assumed that the output signals from the 1st to 7th delay circuits are on the LOW level and that the output signal from the 8th delay circuit is on the HIGH level. When 1 ns has elapsed (TIME 1), the output signal from the 1st delay circuit shifts from the LOW level to the HIGH level since the input signal thereto (i.e., the output signal from the 8th delay circuit) is on the HIGH level. The output signals from the 2nd to 7th delay circuits remain on the LOW level. When another 1 ns has elapsed (TIME 2), the output signal from the 2nd delay circuit shifts from the LOW level to the HIGH level since the input signal thereto (i.e., the output signal from the 1st delay circuit) is on the HIGH level. In this manner, signal transition proceeds by one delay circuit every time 1 ns has elapsed. The respective output signals from the delay circuits are inputted to the operating circuit 15 via the row of sampling circuits 13 and via the row of holding circuits 14 and converted to 3-bit numeric data as shown in the rightmost column of Table 1.

The counter 16a counts the number of circulations made by signal transition at the output terminal of the 8th delay circuit. When signal transition has made one circulation around the delay circuit ring 11 (TIME 8), the output signal from the 8th delay circuit shifts from the HIGH level to the LOW level, so that the counter 16a adds 1 to count data. The counter-output holding circuit 16b outputs the held count data to the operating circuit 15 on the rising edge of the pulse signal to be measured. The operating circuit 15 calculates time data representing the time at which the pulse signal to be measured rises based on the 3-bit numeric data and the count data.

The present embodiment is characterized in that the row of sampling circuits 13 provided between the delay circuit ring 11 and the row of holding circuits 14 prevents a mishold in the row of holding circuits 14. Below, a description will be given to the operation of the row of sampling circuits 13.

Figure 2A:
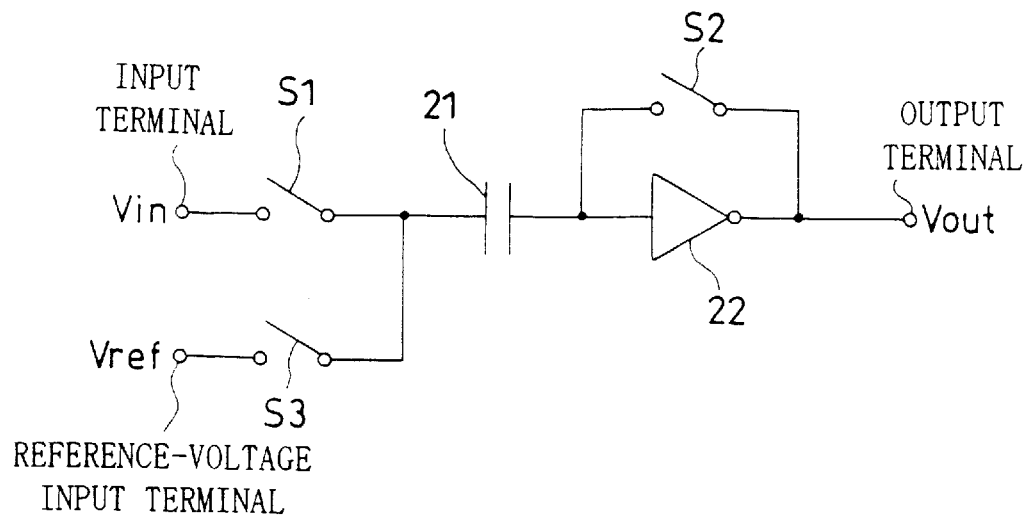
FIG. 2(a) is a circuit diagram showing an example of the structure of a sampling circuit in the time counting circuit according to the first embodiment of the present invention and FIG. 2(b) illustrates the operation of the sampling circuit of FIG. 2(a)

FIG. 2(a) is a circuit diagram showing an example of the structure of the sampling circuit, in which are shown: a capacitance 21; an inverting amplifier circuit 22; a first switch S1; a second switch S2; and a third switch S3. In the sampling circuit, the input terminal is connected to one terminal of the capacitance 21 via the first switch S1, while the reference-potential input terminal is connected to one terminal of the capacitance 21 via the third switch S3. The other terminal of the capacitance 21 is connected to the input terminal of the inverting amplifier circuit 22. The input and output terminals of the inverting amplifier circuit 22 are connected to each other via the second switch S2.

In the case of using the sampling circuit shown in FIG. 2(a) in the time counting circuit shown in FIG. 1, the input terminal of the sampling circuit is connected to the output terminal of the corresponding one of the delay circuits composing the delay circuit ring 11, while the output terminal of the sampling circuit is connected to the input terminal of the corresponding one of the flip-flops composing the row of holding circuits 14. The ON-OFF operation of each of the switches is controlled by the first switch signal 12a received from the switch-signal generating circuit 12.

Figure 2B:
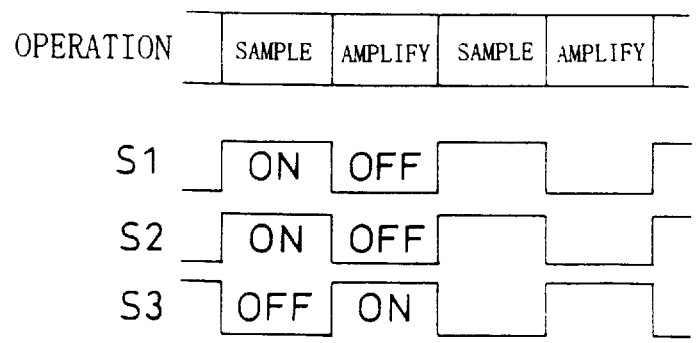

The operation of the sampling circuit shown in FIG. 2(a) will be described with reference to FIG. 2(b). First, in the sampling operation, the first and second switches S1 and S2 are turned ON and the third switch S3 is turned OFF. At this stage, the input voltage Vin is applied to one terminal of the capacitance 21. The input voltage Vin is equal to the potential of the output signal from the delay circuit. The same potential Va is outputted to the input and output terminals of the inverting amplifier circuit 22, while the potential Va is applied to the other terminal of the capacitance 21. Consequently, electric charges are accumulated in the capacitance 21 due to the potential difference (Vin−Va). The output potential Vout becomes equal to the potential Va.

Next, in the amplifying operation, the first and second switches S1 and S2 are turned OFF and the third switch S3 is turned ON. At this stage, a reference potential Vref is applied to one terminal of the capacitance 21. Since the electric charges accumulated in the capacitance 21 are kept, the potential difference (Vin−Va) in the sampling operation is maintained as it is so that the potential at the other terminal of the capacitance 21 changes from Va to (Vref−(Vin−Va))=(Vref−Vin+Va). Hence, the output potential Vout becomes $$\text{Vout} = -G(\text{Vref} - \text{Vin} + \text{Va} - \text{Va}) + \text{Va} = G(\text{Vin} - \text{Vref}) + \text{Va} \quad (1)$$

where G is a voltage gain of the inverting amplifier circuit 22.

As can be understood from the equation (1), the output signal from the delay circuit is sampled in the sampling operation and the differential voltage between the potential Vin of the sampled signal and the reference potential Vref is amplified in the amplifying operation to be added to the constant potential Va so that the sum of the amplified differential voltage and the constant potential Va is outputted to the holding circuit.

Figure 3A:
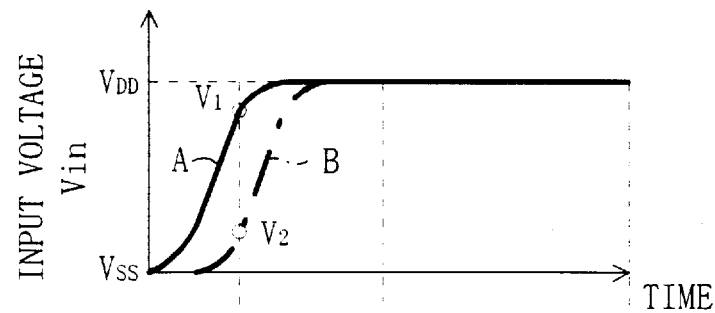
FIG. 3(a) shows an input voltage Vin.
Figure 3B:
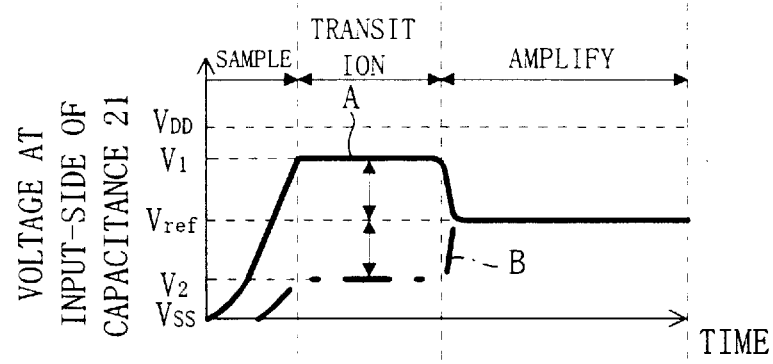
FIG. 3(b) shows the input-side voltage of a capacitance 21.
Figure 3C:
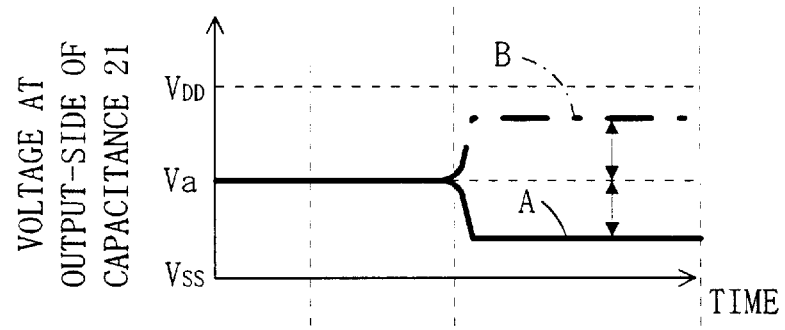
FIG. 3(c) shows the output-side voltage of the capacitance 21.
Figure 3D:
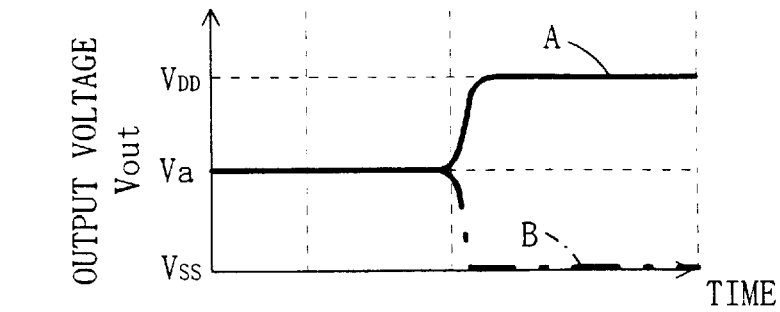
FIG. 3(d) shows an output voltage Vout.

FIGS. 3 are graphs each showing voltage transitions in the sampling circuit shown in FIG. 2, of which FIG. 3(a) shows the input voltage Vin, FIG. 3(b) shows the input-side voltage of the capacitance 21, FIG. 3(c) shows the output-side voltage of the capacitance 21, and FIG. 3(d) shows the output voltage Vout.

As shown in FIG. 3(a), the signal A represented by the solid line is assumed to be ahead of the signal B represented by the dash-dot line in time. As shown in FIG. 3(b), the input voltage Vin at the completion of the sampling operation is held as the input-side voltage of the capacitance 21 during the transitional period from the sampling operation to the amplifying operation. In FIG. 3(b), the voltage V1 is held for the signal A and the voltage V2 is held for the signal B.

As shown in FIG. 3(c), the difference between the input-side voltage of the capacitance 21 and the reference voltage Vref is added to the output-side voltage of the capacitance 21 in the amplifying operation. As shown in FIG. 3(d), the output-side voltage of the capacitance 21 is inverted and amplified by the inverting amplifier 22 to become the output voltage Vout. The output voltage Vout of the signal A becomes substantially equal to the power-source voltage VDD, while the output voltage Vout of the signal B becomes substantially equal to the ground voltage VSS.

Figure 4A:
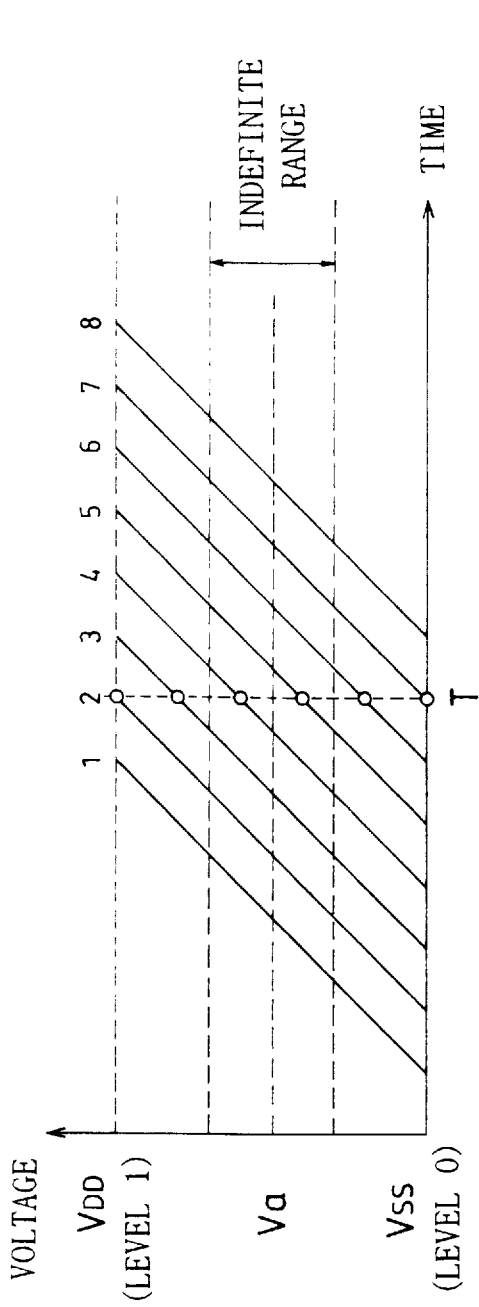
FIG. 4(a) is a graph showing the transitions of the output voltage from respective delay circuits and FIG. 4(b) is a graph showing the transitions of the output voltages from respective sampling circuits.
Figure 4B:
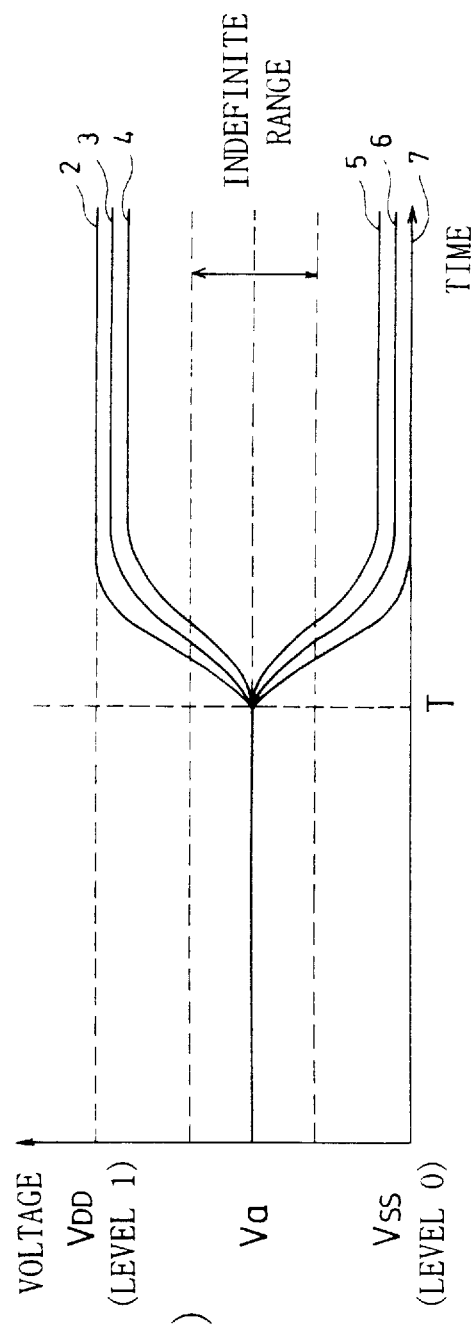

FIG. 4(a) is a graph showing the potential transitions of the output signals from the respective delay circuits composing the delay circuit ring 11. In the drawing, the straight line 1 represents the potential transition of the output signal from the 1st delay circuit. Likewise, the straight lines 2 to 8 represent the potential transitions of the output signals from the 2nd to 8th delay circuits. FIG. 4(b) is a graph showing the potential transitions of the output signals from the respective sampling circuits 13a. In the drawing, the curves 2 to 7 represent the potential transitions of the output signals from the 2nd to 7th sampling circuits and the time T represents the time at which the pulse signal to be measured rises.

Each of the sampling circuits 13a composing the row of sampling circuits 13 outputs a given reference voltage Va before the pulse to be measured rises. When the pulse signal to be measured rises (TIME T), each of the sampling circuits 13a receives the first switch signal 12a from the switch-signal generating circuit 12 and samples the output signal from the delay circuit to which it is connected. In FIG. 4(a), the potentials of the sampled signals are represented by the hollow circles. Each of the sampling circuits 13a further amplifies the differential voltage between the potential of the sampled signal and the reference potential Va, adds the amplified differential voltage to the reference potential Va, and outputs the sum of the amplified differential voltage and the reference potential Va.

Accordingly, the potential of the output signal from each of the sampling circuits 13a no more exists in the range in which the flip-flop may hold it as either "0" or "1", i.e., in the so-called indefinite range. It follows therefore that the flip-flop 14a composing the row of holding circuits 14 receives only a signal constantly held as "0" or a signal constantly held as "1".

As a result, a mishold no more occurs in the row of holding circuits 14. Additionally, even if the threshold voltage varies in the flip-flops 14a, linearity is ensured for the relationship between real time and time data.

Although FIG. 2 shows the sampling circuit of typical structure, it is possible to design a sampling circuit with a higher amplification factor.

Figure 5A:
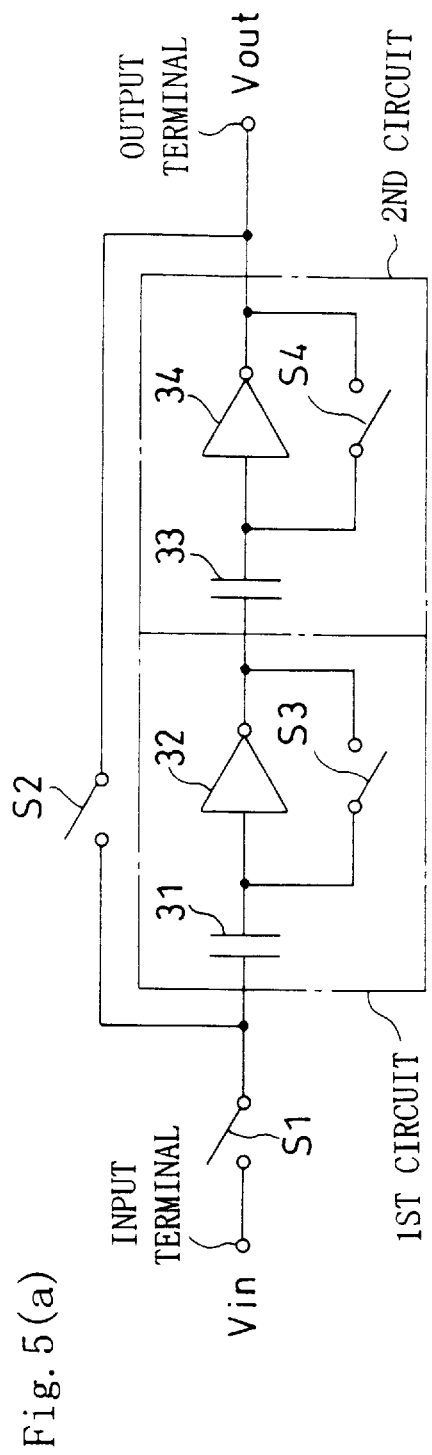
FIG. 5(a) is a circuit diagram showing another example of the structure of the sampling circuit in the time counting circuit according to the first embodiment of the present invention and FIG. 5(b) illustrates the operation of the sampling circuit of FIG. 5(a)

FIG. 5(a) is a circuit diagram showing another example of the structure of the sampling circuit. In the drawing are shown: a first capacitance 31; a first inverting amplifier circuit 32; a second capacitance 33; a second inverting amplifier circuit 34; a 1st switch S1; a 2nd switch S2; a 3rd switch S3; and a 4th switch S4. In the sampling circuit, the input terminal is connected to one terminal of the first capacitance 31 via the 1st switch S1, while the other terminal of the first capacitance 31 is connected to the input terminal of the first inverting amplifier circuit 32. The output terminal of the first inverting amplifier circuit 32 is connected to one terminal of the second capacitance 33, while the other terminal of the second capacitance 33 is connected to the input terminal of the second inverting amplifier circuit 34. The input terminal of the first capacitance 31 is connected to the output terminal of the second inverting amplifier circuit 34 via the 2nd switch S2. The input and output terminals of the first inverting amplifier circuit 32 are connected to each other via the 3rd switch S3. The first capacitance 31, the first inverting amplifier circuit 32, and the 3rd switch S3 constitute a first circuit. The input and output terminals of the second inverting amplifier circuit 34 are connected to each other via the 4th switch S4. The second capacitance 33, the second inverting amplifier circuit 34, and the 4th switch S4 constitute a second circuit.

In the case of using the sampling circuit shown in FIG. 5(a) in the time counting circuit shown in FIG. 1, the input terminal of the sampling circuit is connected to the output terminal of the corresponding one of the delay circuits composing the delay circuit ring 11, while the output terminal of the sampling circuit is connected to the input terminal of the corresponding one of the flip-flops 14a composing the row of holding circuits 14. The ON-OFF operation of each of the switches is controlled by the first switch signal 12a received from the switch-signal generating circuit 12.

Figure 5B:
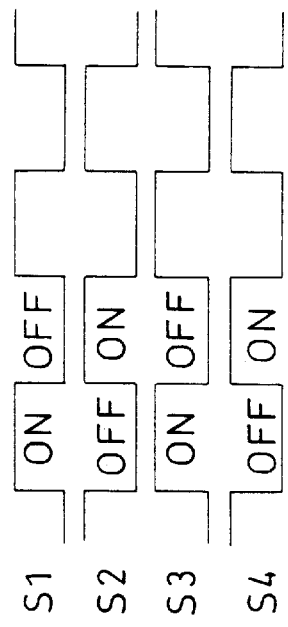

The operation of the sampling circuit shown in FIG. 5(a) will be described with reference to FIG. 5(b). First, in the sampling operation of the first circuit, the 1st and 3rd switches S1 and S3 are turned ON and the 2nd and 4th switches S2 and S4 are turned OFF. At this stage, the input voltage Vin is applied to one terminal of the first capacitance 31. The input voltage Vin is equal to the potential of the output signal from the delay circuit. The same potential Va1 is observed at the input and output terminals of the first inverting amplifier circuit 32. The potential Va1 is applied to the other terminal of the first capacitance 31. Consequently, electric charges are accumulated in the first capacitance 31 due to the potential difference (Vin–Va1).

Next, in the amplifying operation of the first circuit, the 1st and 3rd switches S1 and S3 are turned OFF and the 2nd and 4th switches S2 and S4 are turned ON. At this stage, the same potential Va2 is observed at the input and output terminals of the second inverting amplifier circuit 34. The potential Va2 is applied to one terminal of the first capacitance 31. Since the electric charges accumulated in the first capacitance 31 are kept, the potential difference (Vin–Va1) in the sampling operation is maintained as it is so that the potential at the other terminal of the first capacitance 31 changes from Va1 to (Va2–(Vin–Va1)). Hence, the output potential Vmid of the first circuit becomes $$Vmid = -G1(Va2-(Vin-Va1)-Va1)+Va1 = G1(Vin-Va2)+Va1$$

where G1 is a voltage gain of the first inverting amplifier circuit 32.

At this stage, the output potential Vmid of the first circuit is applied to one terminal of the second capacitance 33, while the potential Va2 at the input terminal of the second inverting amplifier circuit 34 is applied to the other terminal of the second capacitance 33. Consequently, electric charges are accumulated in the second capacitance 33 due to the potential difference (Vmid–Va2). As a result, the second circuit performs sampling operation.

Next, in the amplifying operation of the second circuit, the 1st switch S1 and 3rd switch S3 are turned ON, while the 2nd switch S2 and 4th switch S4 are turned OFF. At this stage, the same potential Va1 is observed at the input and output terminals of the first inverting amplifier circuit 32, while the potential Va1 is applied to one terminal of the second capacitance 33. Since electric charges accumulated in the second capacitance 33 are kept, the potential difference (Vmid–Va2) in the sampling operation is maintained as it is so that the potential at the other terminal of the second capacitance 33 changes from Va2 to (Va1–(Vmid–Va2). Hence, the output potential Vout becomes $$\begin{align} Vout &= -G2(Va1-(Vmid-Va2)-Va2)+Va2 \quad (2)\\ &= G2(Vmin-Va1)+Va2\\ &= G2\{G1(Vin-Va2)+Va1-Va1\}+Va2\\ &= G2\,G1(Vin-Va2)+Va2 \end{align}$$

where G2 is a voltage gain of the second inverting amplifier circuit 34.

As can be understood from the equation (2), the output signal from the delay circuit is sampled in the sampling operation and the differential voltage between the potential Vin of the sampled signal and the constant potential Va2 is amplified in the sampling operation of the first and second circuits to be added to the constant potential Va2 so that the sum of the amplified differential voltage and the constant potential Va2 is outputted to the holding circuit. Through a comparison of the equations (1) and (2), it will be appreciated that the equation (2) provides a higher amplification factor.

Figure 6:
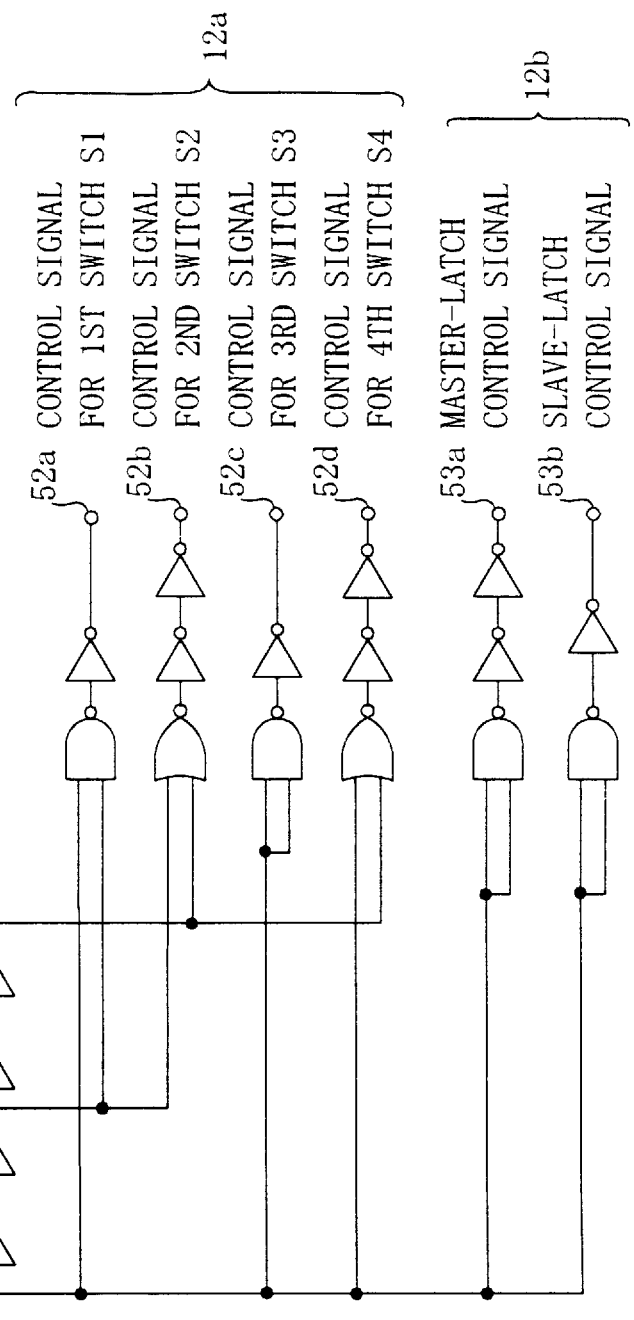
FIG. 6 is a circuit diagram showing the internal structure of a switch-signal generating circuit in the time counting circuit according to the first embodiment of the present invention.

FIG. 6 is a circuit diagram showing an example of the internal structure of the switch-signal generating circuit 12. In the drawing, the pulse signal to be measured is inputted to an input terminal 51, while the first switch signal 12a for controlling the operation of the sampling circuit 13a is outputted from output terminal 52a, 52b, 52c, and 52d and the second switch signal 12b for controlling the operation of the flip-flop 14a is outputted from output terminals 53a and 53b.

The output terminal 52a outputs a signal for controlling the 1st switch S1 of the sampling circuit 13a. Likewise, the output terminals 52b, 52c, and 52d output signals for controlling the 2nd, 3rd, and 4th switches S2, S3, and S4 of the sampling circuit 13a, respectively. The output terminal 53a outputs a signal for controlling the master latch of the flip-flop 14a, while the output terminal 53b outputs a signal for controlling the slave latch of the flip-flop 14a.

Figure 7:
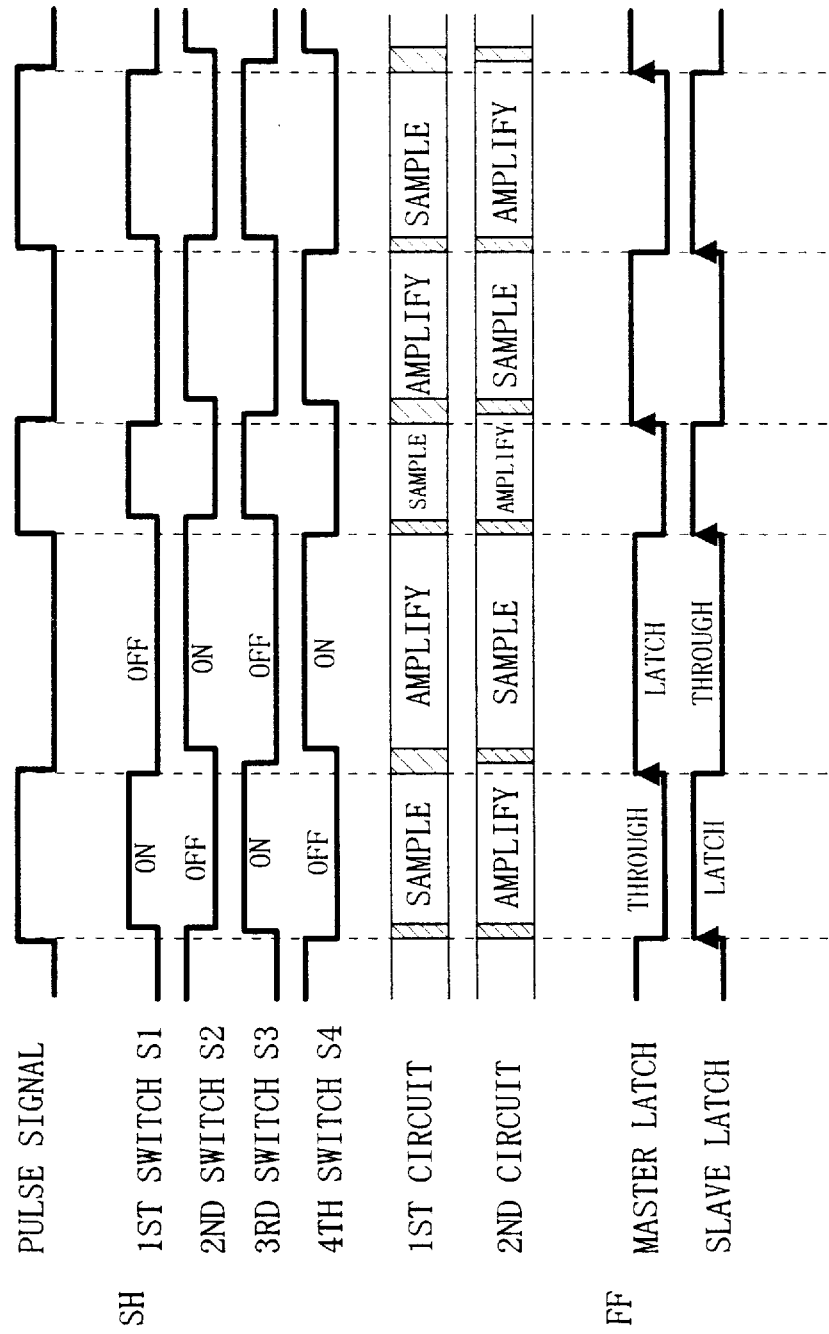
FIG. 7 is a timing chart showing signals outputted from the switch-signal generating circuit shown in FIG. 6 and respective operations of the sampling circuits and flip-flops.

FIG. 7 is a timing chart showing signals outputted from the switch-signal generating circuit 12 and respective operations of the sampling circuit 13a and flip-flop 14a. In response to the 1st switch signal 12a generated based on the pulse signal to be measured, the 1st and 2nd circuits of the sampling circuit 13a repeatedly perform the sampling and amplifying operations. In the drawing, the hatched portions indicate transitional periods from the sampling operation to the amplifying operation and from the amplifying operation to the sampling operation. The flip-flop 14a repeatedly perform through and latching operations in response to the 2nd switch signal 12b generated based on the pulse signal to be measured.

Figure 8:
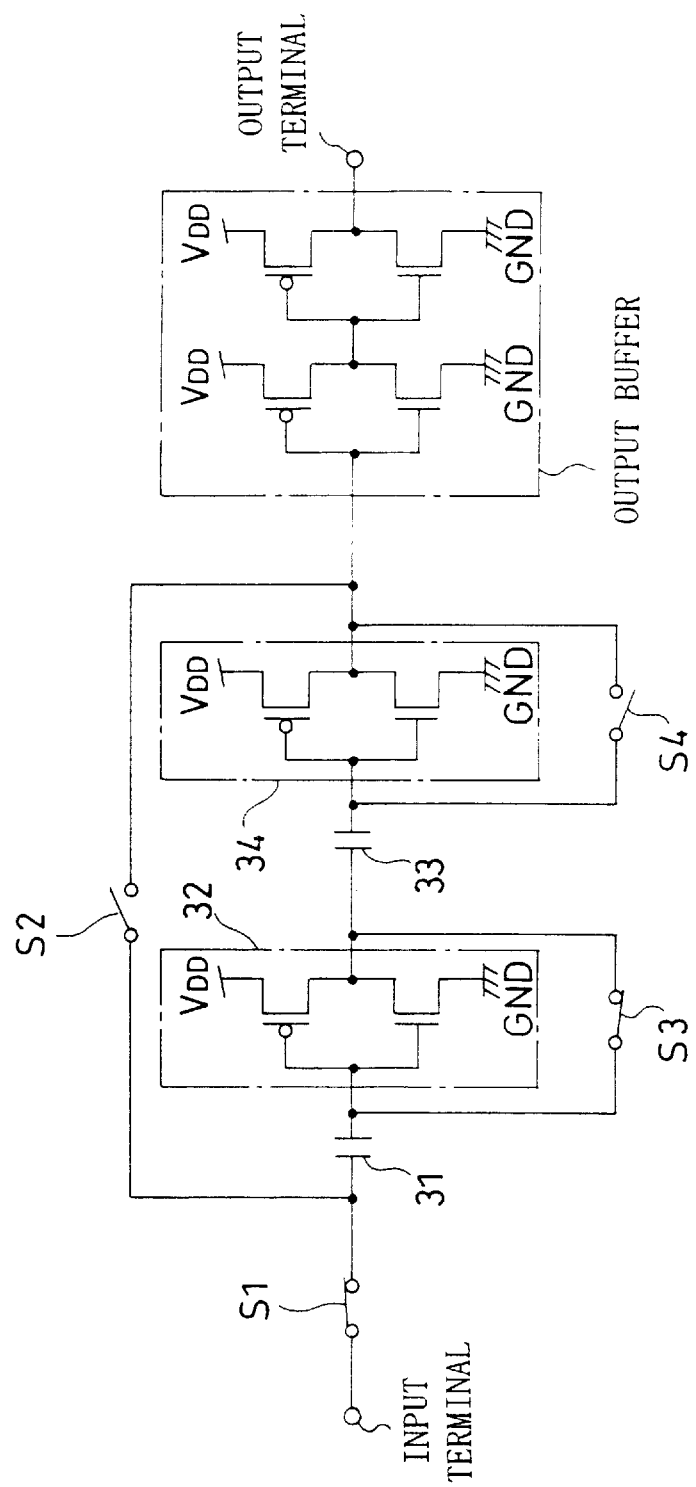
FIG. 8 is a circuit diagram of the sampling circuit using CMOS inverters.

The respective sampling circuits shown in FIGS. 2 and 5 can be implemented simply by using CMOS inverters as the inverting amplifier circuits. FIG. 8 is a circuit diagram showing an example of the structure of the sampling circuit using the CMOS inverters, which is obtained by composing the first and second inverting amplifier circuits 32 and 34 in the sampling circuit shown in FIG. 5(a) of the CMOS inverters. The sampling circuit shown in FIG. 8 further comprises an output buffer composed of two CMOs inverters connected in series anterior to the output terminal. Since the operation of the sampling circuit is the same as that of the sampling circuit shown in FIGS. 5, the description thereof is omitted here.

The sampling circuit shown in FIG. 5 is excellent not only in terms of amplification factor, but also in terms of stability with respect to variations in power-source voltage, which will be described below.

Figure 9:
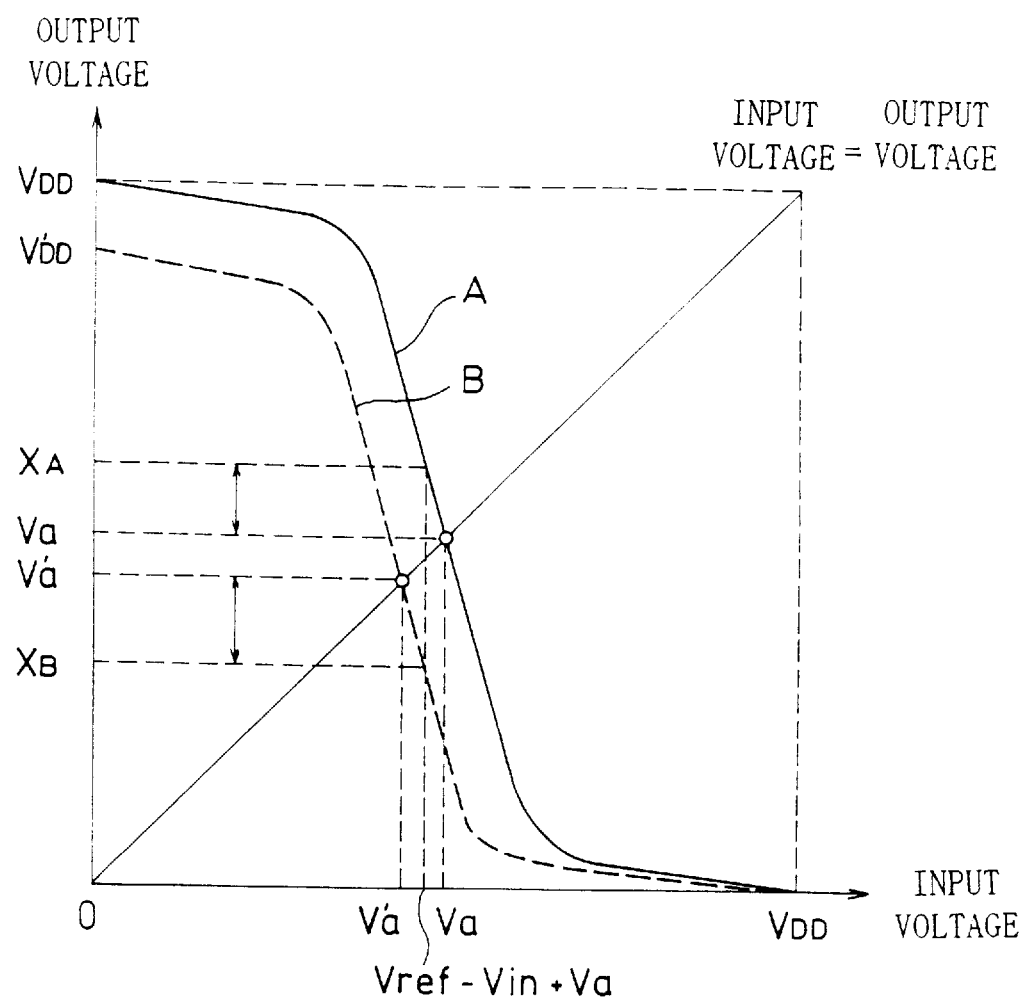
FIG. 9 is a graph showing the characteristic of the CMOS inverter.

FIG. 9 is a graph showing the characteristic of the CMOS inverter. In the graph, the horizontal axis represents an input voltage to the CMOS inverter, the vertical axis represents an output voltage from the CMOS inverter, and the solid line A represents a relationship between the input and output voltages. The point of intersection of the line representing INPUT VOLTAGE=OUTPUT VOLTAGE and the solid line A indicates the reference voltage Va. As can be seen from the graph, the gradient of the solid line A is steep in the vicinity of the reference voltage Va and the voltage gain of the CMOS inverter is large in the vicinity of the reference voltage Va. Accordingly, when the input voltage is close to the reference voltage, the differential voltage between the input voltage and the reference voltage Va is largely amplified.

In the case of using the CMOS inverter in the inverting amplifier circuit 22 shown in FIGS. 2, since the input voltage to the CMOS inverter is (Vref−Vin+Va) in the amplifying operation, the differential voltage is largely amplified when (Vref−Vin+Va) is close to the reference voltage Va so that the output voltage becomes $X_A$.

However, when the power-source voltage is lowered from VDD to V'DD, the relationship between the input and output voltages to and from the CMOS inverter becomes as represented by the dashed line B. Accordingly, the reference voltage is also lowered from Va to V'a. When the power-source voltage is lowered to V'DD in the amplifying operation, the reference voltage V'a may be lower than the input voltage (Vref−Vin+Va) to the CMOS inverter, as shown in FIG. 9. In this case, the differential voltage is largely amplified in the negative direction so that the output voltage becomes $X_B$. Consequently, the logic represented by the output voltage is inverted, which is unfavorable.

Figure 10:
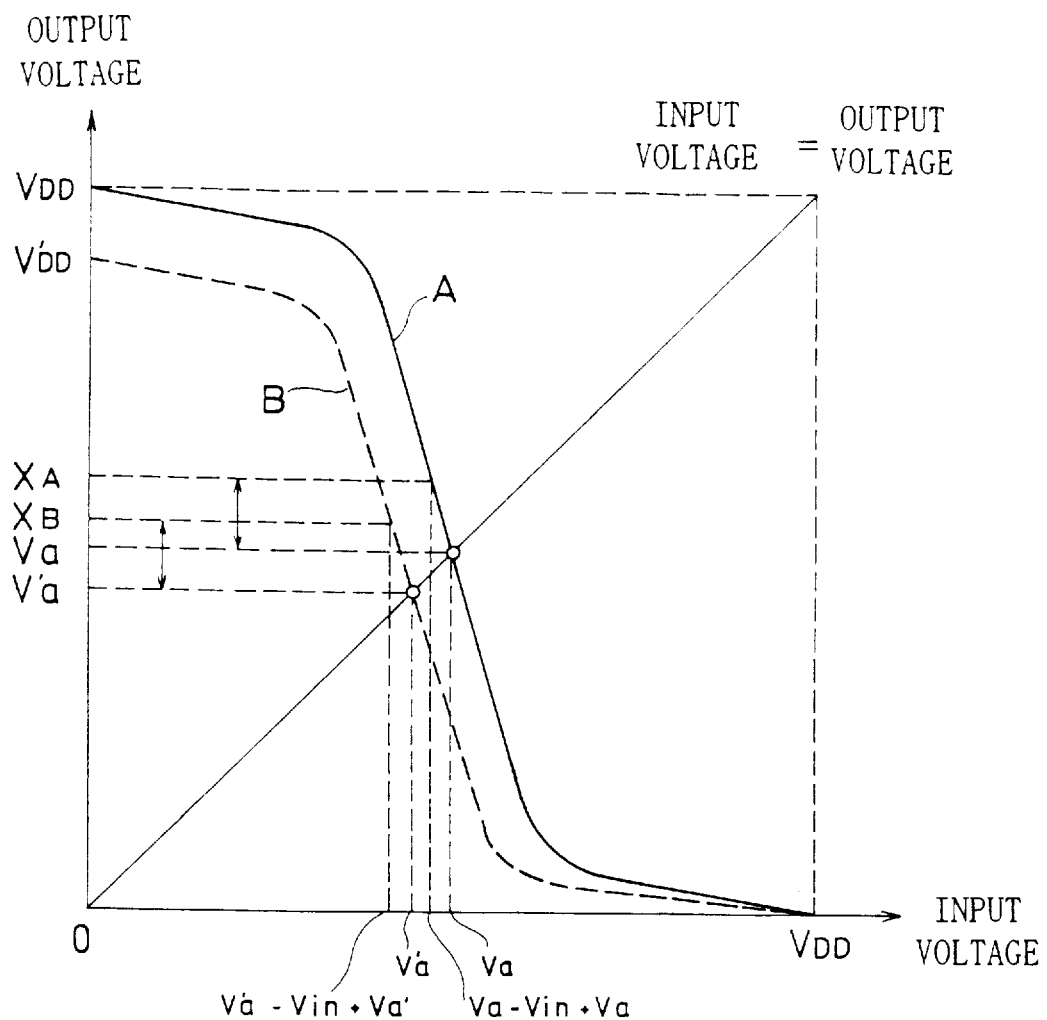
FIG. 10 is a graph showing the characteristic of the CMOS inverter.

By contrast, the sampling circuit shown in FIG. 5 is immune to the influence of variations in power-source voltage. FIG. 10 is a graph showing the characteristic of the CMOS inverter for illustrating the operation of the sampling circuit shown in FIG. 5, in which the CMOS inverters are used as the first and second inverting amplifier circuits 32 and 34. In the graph, the horizontal axis represents the input voltage to the CMOS inverter, the vertical axis represents the output voltage from the CMOS inverter, the solid line A represents the relationship between the input and output voltages, and the dashed line B represents the relationship between the input and output voltages when the power-source voltage is lowered from VDD to V'DD, similarly to FIG. 9.

It is assumed here that the first and second CMOS inverters are used as the first and second inverting amplifier circuits 32 and 34, respectively. It is also assumed that each of the first and second CMOS inverters has a characteristic as shown in FIG. 10 and uses a reference voltage equal to Va.

In the amplifying operation of the first circuit, the input voltage to the first CMOS inverter becomes Va−(Vin−Va)=Va−Vin+Va.

When the input voltage (Va−Vin+Va) is close to the reference voltage Va, the differential voltage therebetween is largely amplified so that the output voltage becomes $X_A$.

When the power-source voltage is lowered from VDD to V'DD, the relationship between the input and output voltages to and from the CMOS inverter becomes as represented by the dashed line B, while the reference voltage is lowered from Va to V'a. However, when the power-source voltage is lowered to V'DD in the amplifying operation of the first circuit, the reference voltage is lowered to V'a and the input voltage is also lowered to (V'a−Vin+V'a), as shown in FIG. 10. Accordingly, the differential voltage is not largely amplified in the negative direction so that the output voltage becomes $X_B$. Consequently, the logic represented by the output voltage is not inverted. It follows therefore that the sampling circuit shown in FIG. 5 is more excellent than the sampling circuit shown in FIG. 2 in terms of stability with respect to variations in power-source voltage.

The function of the sampling circuit in the time counting circuit of the present invention can be implemented by using a circuit other than a sampling circuit.

Figure 11A:
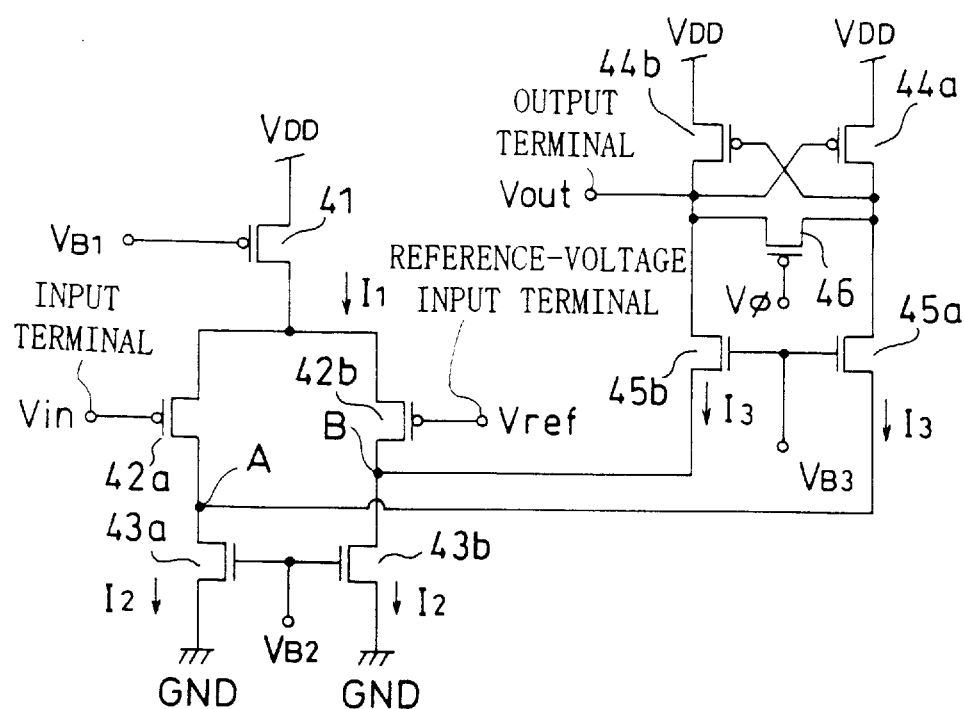
FIG. 11(a) is a circuit diagram of a folded cascode circuit and FIG. 11(b) illustrates the operation thereof.

FIG. 11(a) is a circuit diagram showing an example of the structure of a folded cascode circuit. Although the folded cascode circuit is not a sampling circuit, it outputs a constant voltage when the switch is ON. The circuit has the function of amplifying a differential voltage between the input voltage and the reference voltage and outputting the amplified differential voltage when the switch is OFF, so that the folded cascode circuit can be used in place of the sampling circuit in the time counting circuit shown in FIG. 1.

In FIG. 11 are shown: a PMOS 41 having a source connected to the power source; a PMOS 42a and a PMOS 42b each having a source connected to the drain of the PMOS 41; an NMOS 43a having a drain connected to the drain of the PMOS 42a and a source connected to the ground; an NMOS 43b having a drain connected to the drain of the PMOS 42b and a source connected to the ground; a PMOS 44a and a PMOS 44b each having a source connected to the power source; an NMOS 45a having a drain connected to the drain of the PMOS 44a and a source connected to the drain of the NMOS 43a; an NMOS 45b having a drain connected to the drain of the PMOS 44b and a source connected to the drain of the NMOS 43b; and a PMOS 46 having a source connected to the drain of the PMOS 44a and a source connected to the drain of the PMOS 44b. The PMOS 46 functions as the switch of the folded cascode circuit.

The input voltage Vin is applied to the gate of the PMOS 42a, while the reference voltage Vref is applied to the gate of the PMOS 42b. The drain voltage of the PMOS 44b is applied to the gate of the PMOS 44a. The drain voltage of the PMOS 44a is applied to the gate of the PMOS 44b. A constant voltage $V_{B1}$ is applied to the gate of the PMOS 41. A constant voltage $V_{B2}$ is applied to the respective gates of the NMOS 43a and NMOS 43b. A constant voltage $V_{B3}$ is applied to the respective gates of the NMOS 45a and NMOS 45b. A voltage for switching Vφ is applied to the gate of the PMOS 46. The drain voltage of the PMOS 44b is outputted as the output voltage Vout.

Figure 11B:
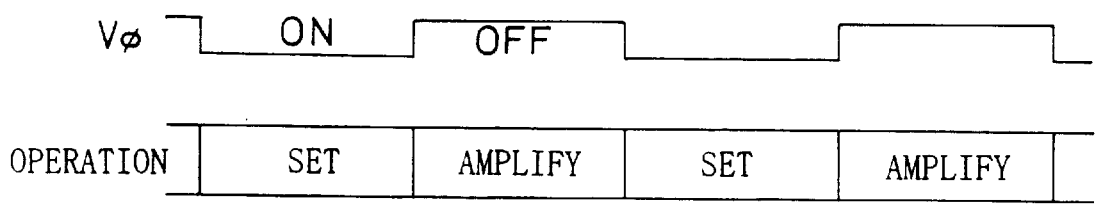

The operation of the folded cascode circuit shown in FIG. 11(a) will be described with reference to FIG. 11(b). As shown in the drawing, when the voltage for switching Vφ is on the LOW level, the PMOS 46 is brought into the conductive state and hence the switch is turned ON, so that the folded cascode circuit is in a so-called set state. When the voltage for switching Vφ is on the HIGH level, on the other hand, the PMOS 46 is brought into the non-conductive state and hence the switch is turned OFF, so that the folded-cascade circuit is in a so-called amplification state.

Since the PMOS 41 serves as a constant current source, a constant current $I_1$ flows through the drain thereof. When the input voltage Vin is equal to the reference voltage Vref, a current $I_1/2$ flows through each of the PMOS 42a and PMOS 42b. Since the PMOS 43a and PMOS 43b serve as constant current sources having identical characteristics, a constant current $I_2$ flows through each of the PMOS 43a and PMOS 43b. Since the PMOS 45a and PMOS 45b also serve as constant current sources having identical characteristics, a constant current $I_3$ flows through each of the PMOS 45a and PMOS 45b. Hence, $$I_1/2 + I_3 = I_2$$

is satisfied.

It is assumed that the input voltage Vin is different from the reference voltage Vref. If Vin>Vref is assumed to be satisfied, the value of the current flowing through the PMOS 42a becomes $I_1/2-\Delta$, while the value of the current flowing through the PMOS 42b becomes $I_1/2+\Delta$, where $\Delta$ is an extremely small value. When the folded cascode circuit is in the set state, the PMOS 46 is in the conductive state, so that the current $\Delta$ corresponding to the variation flows from the terminal B to the terminal A through the PMOS 46. Consequently, the current flowing through the PMOS 44a and PMOS 44b does not change, so that the output voltage Vout does not change, either.

When the folded cascode circuit is in the amplification state, the PMOS 46 is in the non-conductive state, so that the current $\Delta$ corresponding to the variation cannot flow any more from the terminal B to the terminal A through the PMOS 46 but flows out to the output terminal. Consequently, the output voltage Vout increases. As a result, the differential potential between the input voltage Vin and the reference voltage Vref is amplified and outputted.

Figure 12:
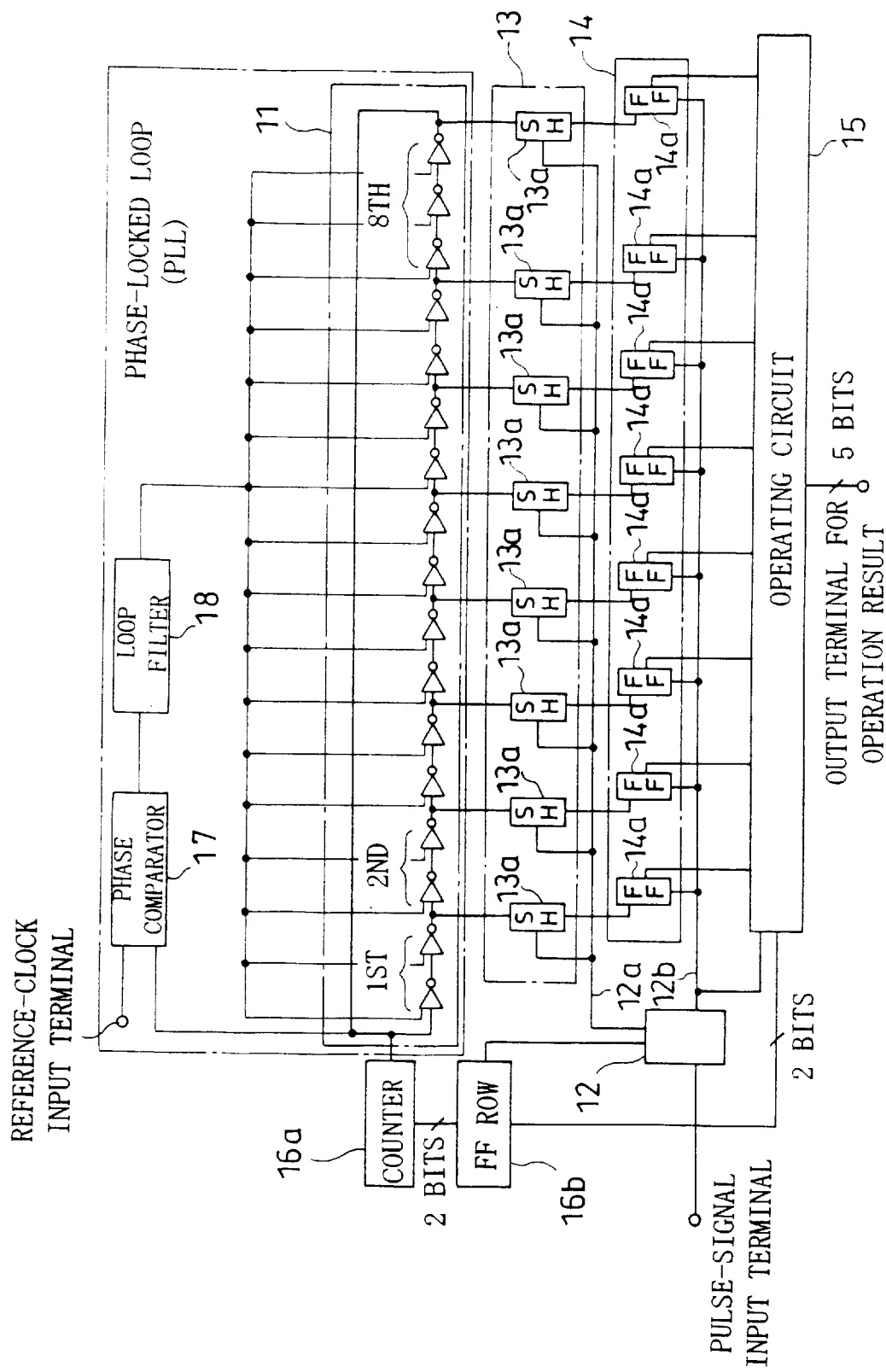
FIG. 12 shows the structure of the time counting circuit according to the first embodiment of the present invention using a phase-locked loop (PLL)

In the time counting circuit according to the present embodiment, a phase-locked loop (PLL) may be used so that the transmission time of signal transition around the delay circuit ring is controlled to be constant. FIG. 12 shows the structure of such a time counting circuit. In the drawing, a phase comparator 17 compares the phase of the signal at the input terminal of the 1st delay circuit of the delay circuit ring 11 with the phase of the reference clock signal. The loop filter 18 receives a direction signal from the phase comparator 17 and outputs a signal for adjusting a delay time to each of the delay circuits composing the delay circuit ring 11. The delay circuit ring 11, the phase comparator 17, and the loop filter 18 constitute the phase locked loop (PLL).

Figure 13A:
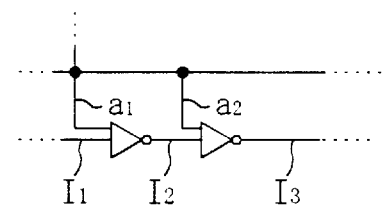
FIG. 13(a) shows the delay circuit in one stage and FIG. 13(b) is a circuit diagram of the delay circuit of FIG. 13(a) shown on a transistor level.
Figure 13B:
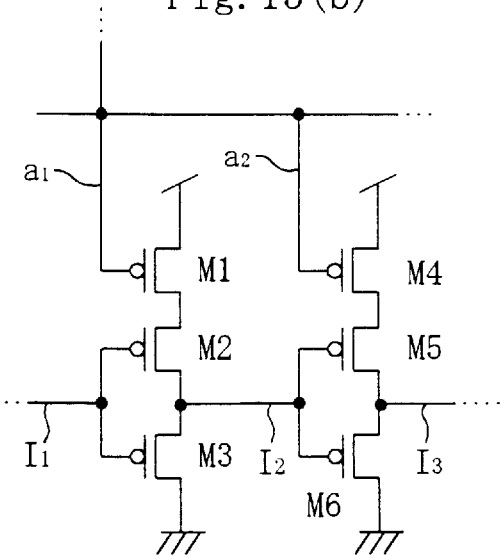

FIGS. 13 are circuit diagrams showing the delay circuits in the time counting circuit using the PLL as shown in FIG. 12, of which FIG. 13(a) shows the delay circuit in one stage and FIG. 13(b) is a circuit diagram of the delay circuit of FIG. 13(a) shown on a transistor level.

In FIGS. 13, the terminal a1 receives a signal for adjusting a signal delay time between the terminals I1 and I2 and the terminal a2 receives a signal for adjusting a signal delay time between the terminals I2 and I3. In the time counting circuit as shown in FIG. 12, the terminals a1 and a2 receive a signal outputted from the loop filter 18.

When the voltage at the terminal a1 increases, the drain current of the transistor M1 decreases so that the rise time of the signal at the terminal I2 is elongated. Conversely, when the voltage at the terminal a1 decreases, the drain current of the transistor M1 increases so that the rise time of the signal at the terminal I2 is shortened. When the voltage at the terminal a2 changes, the drain current of the transistor M4 changes similarly so that the rise time of the signal at the terminal I3 changes.

A consideration will be given to the case where the signal at the terminal I1 rises. In this case, the voltage at the terminal I2 falls and subsequently the voltage at the terminal I3 rises, resulting in signal propagation.

First, it is assumed that the voltages at the terminals a1 and a2 increase. The fall time of the signal at the terminal I2 is predominantly determined by the drain current of the transistor M3, so that the voltage increase at the terminal a1 causes only a slight change in the fall time. However, the rise time of the signal at the terminal I3 is elongated by a decrease in the drain voltage of the transistor M4 caused by the voltage increase at the terminal a2. Accordingly, the signal delay time is elongated.

Next, it is assumed that the voltages at the terminals a1 and a2 decrease. Since the fall time of the signal at the terminal I2 is predominantly determined by the drain current of the transistor M3, the voltage decrease at the terminal a1 causes only a slight change in the fall time. However, the rise time of the signal at the terminal I3 is shortened by the increase in the drain current of the transistor M4 caused by the voltage decrease at the terminal a2. Accordingly, the signal delay time is shortened.

The signal delay time changes similarly in the case where the signal falls at the terminal I1. In this manner, the signal delay time in the delay circuit can be adjusted by the signals inputted to the terminals a1 and a2.

As described above, with the time counting circuit according to the present embodiment, a mishold in the row of holding circuits can be prevented by providing the row of converting circuits composed of the sampling circuits or folded cascode circuits between the delay circuit ring and the row of holding circuits, while an error resulting from variations in the threshold voltages of the flip-flops composing the row of holding circuits can be prevented.

It is not necessary to provide the sampling circuit or folded cascode circuit for each of the delay circuits. For example, the sampling circuit or folded cascode circuit may be provided for every other delay circuit in an alternating configuration.

(Second Embodiment)

The idea of using the above logic analyzing circuit in the time counting circuit according to the first embodiment to analyze the logic of a signal based on the potential obtained by amplifying a differential voltage between the potential of the signal and the first given potential at the directed time and adding the amplified differential voltage to the second given potential can also be used for other applications. A second embodiment of the present invention relates to a skew adjusting circuit using the logic analyzing circuit.

In the case where a clock pulse signal outputted from one circuit and a clock pulse outputted from another circuit are supplied to a certain digital circuit, the digital circuit malfunctions when the clock pulse signals have different delay times, which is due to a so-called clock skew or data skew.

It has been pointed out that the malfunction due to the skew presents more serious problems as the operating frequency of the digital circuit becomes higher. Even a slight difference between the delay times (1 ns or less) of the clock pulse signals may cause the malfunction of the digital circuit. The skew adjusting circuit is for reducing the skew by reducing a difference between the delay times of a plurality of clock pulse signals.

Figure 14:
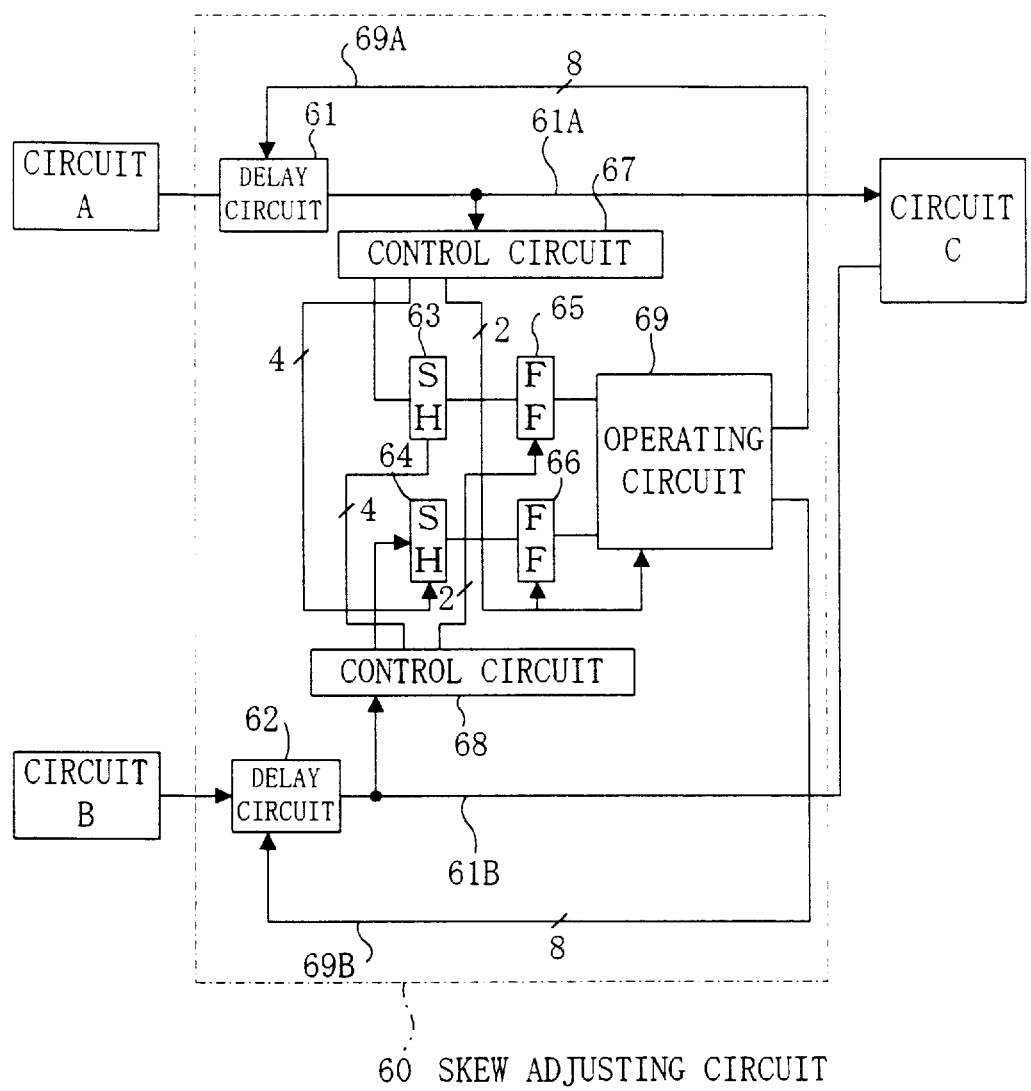
FIG. 14 is a block diagram showing the structure of a skew adjusting circuit according to a second embodiment of the present invention.

FIG. 14 is a block diagram showing the structure of the skew adjusting circuit according to the present embodiment. In the drawing is shown the skew adjusting circuit 60 for reducing a difference between the delay times of the clock pulse signals outputted from the circuits A and B before supplying the clock pulse signals to the circuit C.

There are also shown: 1st and 2nd delay circuits 61 and 62 for delaying the inputted clock pulse signals in time and outputting the delayed clock pulse signals; first and second sampling circuits 63 and 64 as the first and second converting circuits; first and second flip-flops 65 and 66 as the first and second holding circuits; a control circuit 67 for supplying a first clock pulse signal 61A outputted from the 1st delay circuit 61 to the first sampling circuit 63 and controlling the second sampling circuit 64, the second flip-flop 66, and the operating circuit 69; a control circuit 68 for supplying a second clock pulse signal 61B outputted from the 2nd delay circuit 62 to the second sampling circuit 64 and controlling the first sampling circuit 63 and the first flip-flop 65; and an operating circuit 69 for performing an operation with respect to the first and second control signals 69A and 69B for controlling respective delay times in the 1st and 2nd delay circuits 61 and 62 based on the output signals from the first and second flip-flops 65 and 66 and outputting the operation result. Each of the first and second sampling circuits 63 and 64 is constructed as shown in FIG. 5(a). The first sampling circuit 63 and the first flip-flop 65 constitute a first logic analyzing circuit. The second sampling circuit 64 and the second flip-flop 66 constitute a second logic analyzing circuit.

First, the operation of the skew adjusting circuit 60 will be roughly described with reference to FIGS. 15, which are graphs showing the time-varying voltages of first and second clock pulse signals 61A and 61B on the rising edges thereof. In each of the graphs, the solid line A represents the first clock pulse signal 61A outputted from the circuit A and delayed by the 1st delay circuit 61 and the solid line B represents the second clock pulse signal 61B outputted from the circuit B and delayed by the 2nd delay circuit 62. Of FIGS. 15, FIG. 15(a) shows the case where the first clock pulse signal 61A is ahead of the second clock pulse signal 61B in time and FIG. 15(b) shows the case where the first clock pulse signal 61A is behind the second clock pulse signal 61B in time.

In the skew adjusting circuit 60, when the first clock pulse signal 61A surpasses the threshold voltage Vth (TIME tA), the voltage of the second clock pulse signal 61B is held in the second sampling circuit 64. On the other hand, when the second clock pulse signal 61B surpasses the threshold voltage Vth (TIME tB), the voltage of the first clock pulse signal 61A is held in the first sampling circuit 63.

Figure 15A:
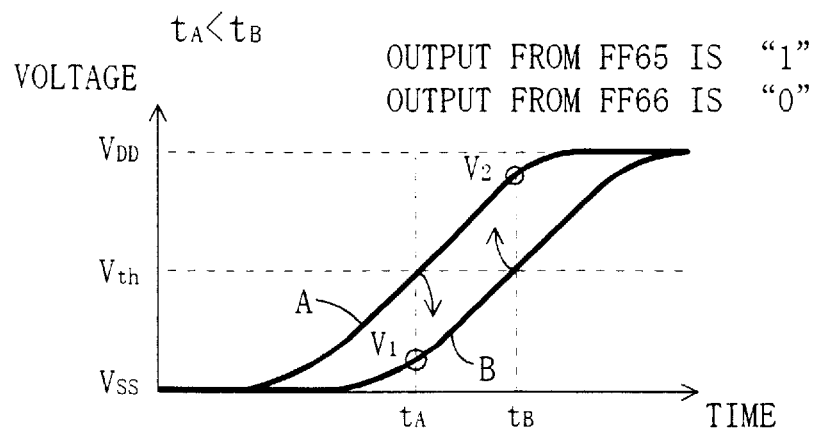
FIG. 15(a) shows the case where the first clock pulse signal is ahead of the second clock pulse signal in time and FIG. 15(b) shows the case where the first clock pulse signal is behind the second clock pulse signal in time.

In the case where the first clock pulse signal 61A is ahead of the second clock pulse signal 61B in time, the voltage V1 of the second clock pulse signal 61B is held in the second sampling circuit 64 at the time tA as shown in FIG. 15(a), so that the held voltage V1 is in turn held by the second flip-flop 66 as the ground voltage VSS (the logic level "0"). On the other hand, the voltage V2 of the first clock pulse signal 61A is held by the first sampling circuit 63 at the time tB, so that the held voltage V2 is in turn held by the first flip-flop 65 as the power-source voltage VDD (logic level "1").

Figure 15B:
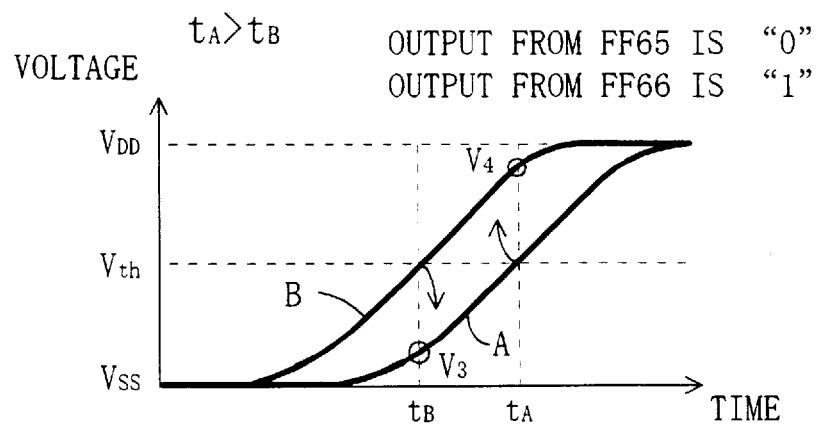

Conversely, in the case where the first clock pulse signal 61A is behind the second clock pulse signal 61B in time, the voltage V3 of the first clock pulse signal 61A is held in the first sampling circuit 63 at the time tB as shown in FIG. 15(b), so that the held voltage V3 is in turn held by the first flip-flop 65 as the ground voltage VSS (the logic level "0"). On the other hand, the voltage V4 of the second clock pulse signal 61B is held by the second sampling circuit 64 at the time tA, so that the held voltage V4 is in turn held by the second flip-flop 66 as the power-source voltage VDD (the logic level "1").

Therefore, the first clock pulse signal 61A is ahead of the second clock pulse signal 61B in time when the data held in the first flip-flop 65 is "1" and the data held by the second flip-flop 66 is "0". On the other hand, the first clock pulse signal 61A is behind the second clock pulse signal 61B in time when the data held in the first flip-flop 65 is "0" and the data held in the second flip-flop 66 is "1".

Since the operating circuit 69 has the function of adjusting respective delay times in the 1st and 2nd delay circuits 61 and 62 based on the data held in the first and second flip-flops 65 and 66, the skew adjusting circuit 60 can reduce a time difference between the first and second clock pulse signals 61A and 61B.

Next, a description will be given to the internal structures of the control circuits 67 and 68.

Figure 16:
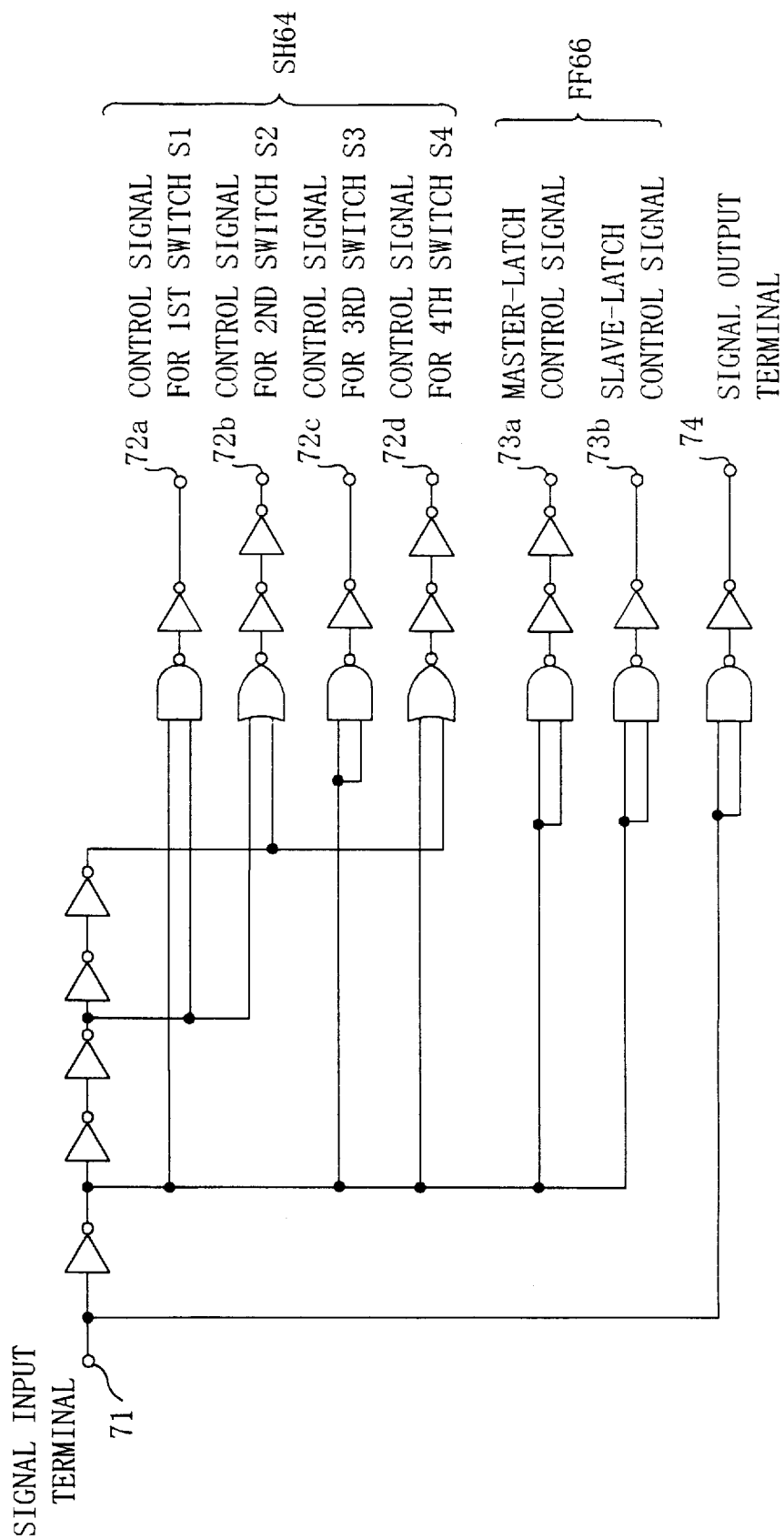
FIG. 16 is a circuit diagram showing an example of the internal structure of a control circuit in the skew adjusting circuit according to the second embodiment of the present invention.

FIG. 16 is a circuit diagram showing an example of the internal structure of the control circuit 67, in which are shown: a signal input terminal 71 for receiving the first clock pulse signal outputted from the circuit A and delayed by the 1st delay circuit 61; output terminals 72a, 72b, 72c, and 72d each for outputting a control signal for controlling the second sampling circuit 64; output terminals 73a and 73b each for outputting a control signal for controlling the second flip-flop 66; and a signal output terminal 74 for outputting the clock pulse inputted to the signal input terminal 71.

The output terminal 72a outputs a signal for controlling the switch S1 of the second sampling circuit 64. Likewise, the output terminals 72b, 72c, and 72d output signals for controlling the switches S2, S3, and S4, respectively. The output terminal 73a outputs a signal for controlling the master latch of the second flip-flop 66, while the output terminal 73b outputs a signal for controlling the slave latch of the second flip-flop 66. The signal outputted from the output terminal 73a is also supplied to the operating circuit 69 to control the operation thereof. The clock pulse signal outputted from the signal output terminal 74 is outputted to the first sampling circuit 63.

Figure 17:
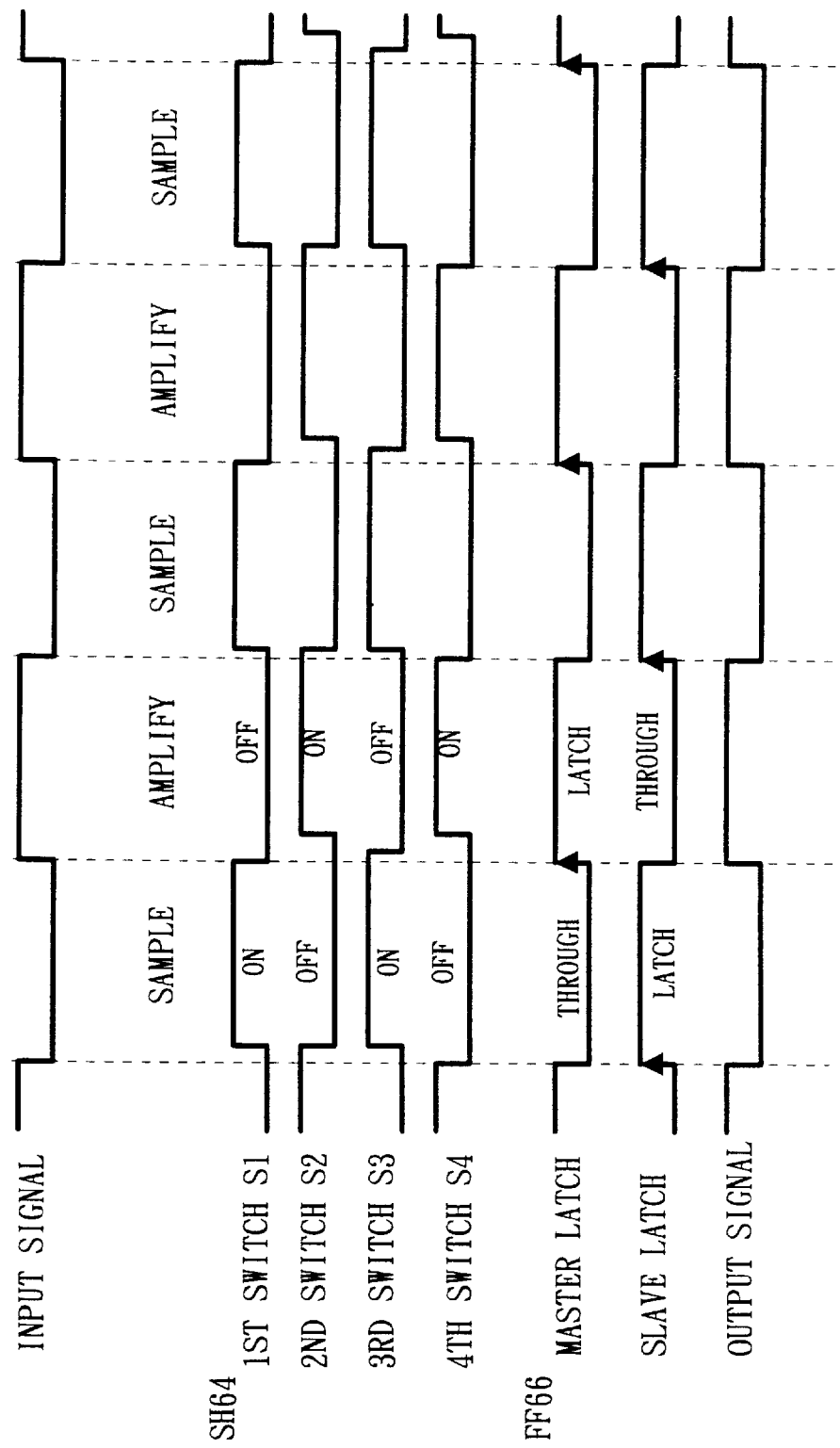
FIG. 17 is a timing chart showing the transitions of the input and output signals to and from the control circuit shown in FIG. 16 and respective operations of the sampling circuit and flip-flops.

FIG. 17 is a timing chart showing the transitions of the input and output signals to and from the control circuit 67 shown in FIG. 16 and respective operations of the second sampling circuit 64 and second flip-flop 66. The second sampling circuit 64 holds the input signal at the time at which the control signal for the switch S1 rises. The second flip-flop 66 holds the output signal from the second sampling circuit 64 as the logic level "1" or "0".

The control circuit 68 is also composed of a circuit as shown in FIG. 16. In the control circuit 68, the signal input terminal 71 receives the second clock pulse signal 61B outputted from the circuit B and delayed by the 2nd delay circuit 62. The clock pulse signal outputted from the signal output terminal 74 is outputted to the second sampling circuit 64. The terminals 72a, 72b, 72c, and 72d output the control signals for controlling the first sampling circuit 63. The terminals 73a and 73b output the control signals for controlling the first flip-flop 65.

Next, a description will be given to the internal structures of the 1st and 2nd delay circuits 61 and 62.

Figure 18:
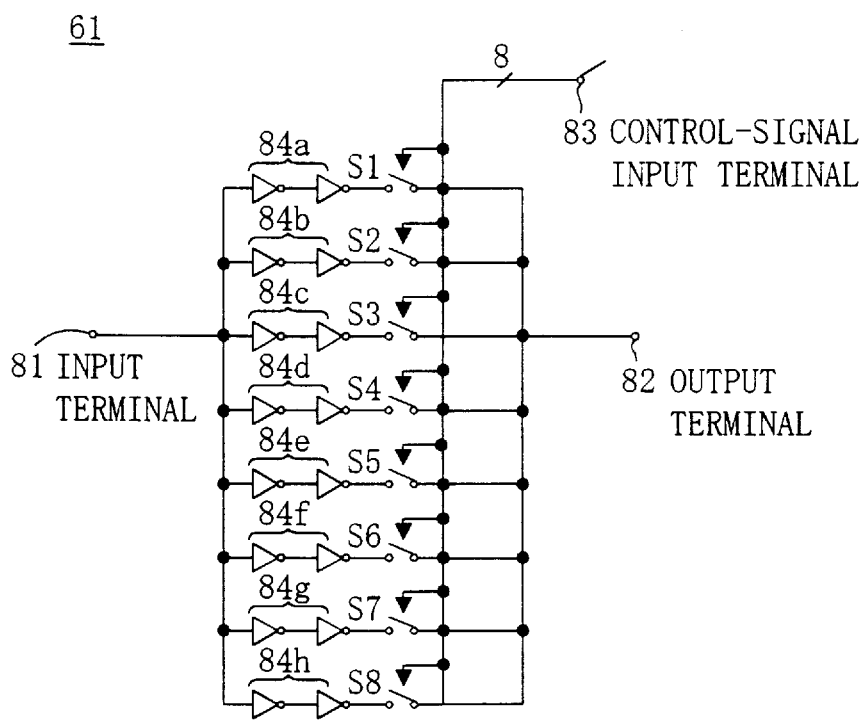
FIG. 18 is a circuit diagram showing an example of the internal structure of a delay circuit in the skew adjusting circuit according to the second embodiment of the present invention.

FIG. 18 is a circuit diagram showing an example of the internal structure of the 1st delay circuit 61, in which are shown: an input terminal 81 for receiving the clock pulse signal outputted from the circuit A; an output terminal 82 for outputting the delayed second clock pulse signal 61B; a control-signal input terminal for receiving the first control signal 69A outputted from the operating circuit 69; and rows of inverters 84a to 84h consisting of inverters connected in series and having different delay times. The rows of inverters 84a to 84h are connected in parallel between the input terminal 81 and the output terminal 82. Between the output terminal 82 and the respective rows of inverters 84a to 84h, there are provided the switches S1 to S8 which are opened and closed under the control of the first control signal 69A inputted to the control-signal input terminal 83.

Table 2 shows an example of respective delay times in the rows of inverters.

TABLE 2

| ROW OF INVERTERS | DELAY TIME [ns] |
|---|---|
| 84a | 0.4 |
| 84b | 0.6 |
| 84c | 0.8 |
| 84d | 1.0 |
| 84e | 1.2 |
| 84f | 1.4 |
| 84g | 1.6 |
| 84h | 1.8 |

As shown in Table 2, the delay times in the respective rows of inverters 84a to 84h range from 0.4 ns to 1.8 ns in increments of 0.2 ns. By selecting among signal paths from the input terminal 81 to the output terminal 82 through the opening and closing of the switches S1 to S8, it becomes possible to adjust the delay time in the first delay circuit 61 in the range of 0.4 ns to 1.8 ns in increments of 0.2 ns. When only the switch S2 is closed, e.g., the delay time in the first delay circuit becomes 0.6 ns.

The 2nd delay circuit 62 is also composed of a circuit as shown in FIG. 18.

Next, a description will be given to the internal structure and operation of the operating circuit 69.

Figure 19:
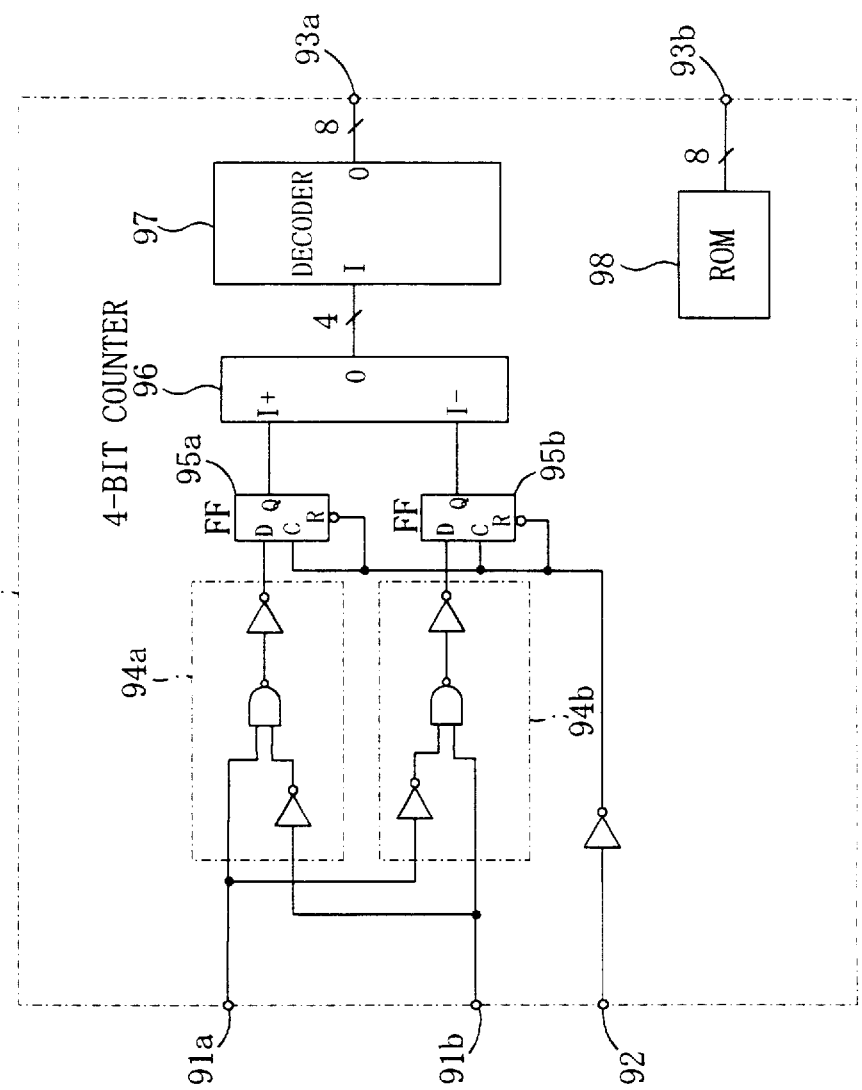
FIG. 19 is a circuit diagram showing an example of the internal structure of an operating circuit in the skew adjusting circuit according to the second embodiment of the present invention.

FIG. 19 is a circuit diagram showing an example of the internal structure of the operating circuit 69, in which are shown: an input terminal 91a for receiving the output data from the first flip-flop 65; an input terminal 91b for receiving the output data from the second flip-flop 66; an input terminal 92 for receiving the control signal outputted from the terminal 73a of the control circuit 67; an output terminal 93a for outputting the first control signal 69A for determining the delay time in the first delay circuit 61; an output terminal 93b for outputting the second control signal 69B for determining the delay time in the 2nd delay circuit 62; logic gates 94a and 94b; flip-flops 95a and 95b; a 4-bit counter 96 for performing an addition with respect to the output data from the flip-flop 95a, while performing a subtraction with respect to the output data from the flip-flop 95b; a decoder 97 for decoding the numeric data from the 4-bit counter 96 to generate the first control signal 69A for determining the delay time in the first delay circuit 61; and a ROM 98 for storing the second control signal 69B for determining the delay time in the second delay circuit 62.

If the data outputted from the first flip-flop 65 and inputted to the input terminal 91a is "1" and the data outputted from the second flip-flop 66 and inputted to the input terminal 91b is "0" (tA<tB), the output data from the logic gate 94a becomes "1" and the output data from the logic gate 94b becomes "0". At this stage, the 4-bit counter 96 adds 1 to the output data previously obtained at the time at which the control signal inputted to the input terminal 92 falls.

On the other hand, if the data outputted from the first flip-flop 65 and inputted to the input terminal 91a is "0" and the data outputted from the second flip-flop 66 and inputted to the input terminal 91b is "1" (tA>tB), the output data from the logic gate 94a becomes "0" and the output data from the logic gate 94b becomes "1". At this stage, the 4-bit counter 96 subtracts 1 from the output data previously obtained at the time at which the control signal inputted to the input terminal 92 falls.

The decoder 97 converts the output data from the 4-bit counter 96 to the 8-bit first control signal 69A. Table 3 shows a relationship between the output data from the 4-bit counter 96 and the switch selected in the first delay circuit 61.

TABLE 3

| OUTPUT DATA FROM 4-BIT COUNTER 96 | SELECTED SWITCH |
|---|---|
| 0 0 0 0 | S1 |
| 0 0 0 1 | |
| 0 0 1 0 | S2 |
| 0 0 1 1 | |
| 0 1 0 0 | S3 |
| 0 1 0 1 | |
| 0 1 1 0 | S4 |
| 0 1 1 1 | |
| 1 0 0 0 | S5 |
| 1 0 0 1 | |
| 1 0 1 0 | S6 |
| 1 0 1 1 | |
| 1 1 0 0 | S7 |
| 1 1 0 1 | |
| 1 1 1 0 | S8 |
| 1 1 1 1 | |

For example, when the output data from the 4-bit counter 96 is "0100" or "0101", the switch S3 is selected so that the delay time in the first delay circuit 61 is 0.8 ns.

On the other hand, the ROM 98 stores the second control signal 69B indicating the selection of the switch S4 so that the delay time in the second delay circuit 62 is fixed to 1.0 ns.

Figure 20:
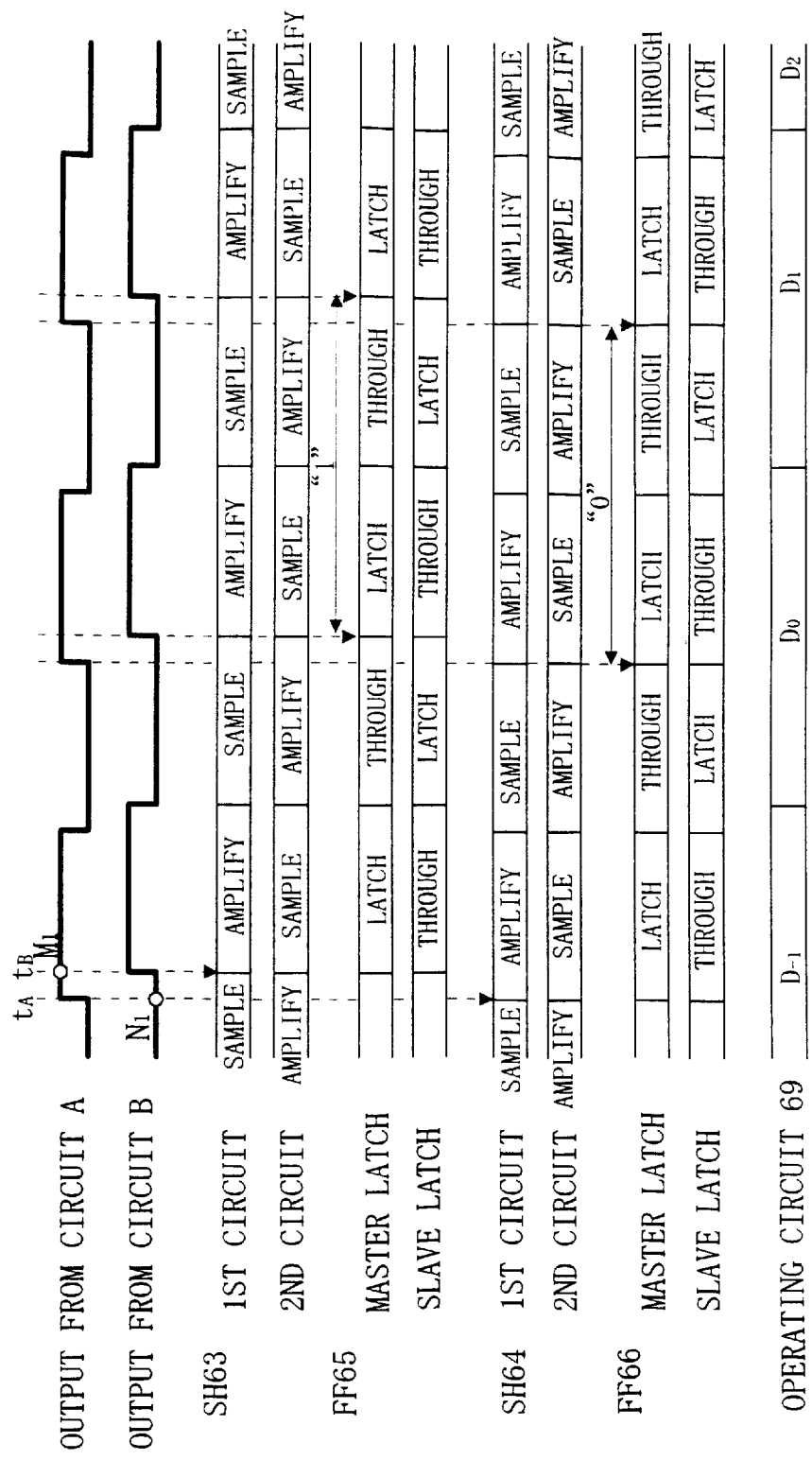
FIG. 20 is a timing chart showing the overall operation of the skew adjusting circuit according to the second embodiment of the present invention.
Figure 21:
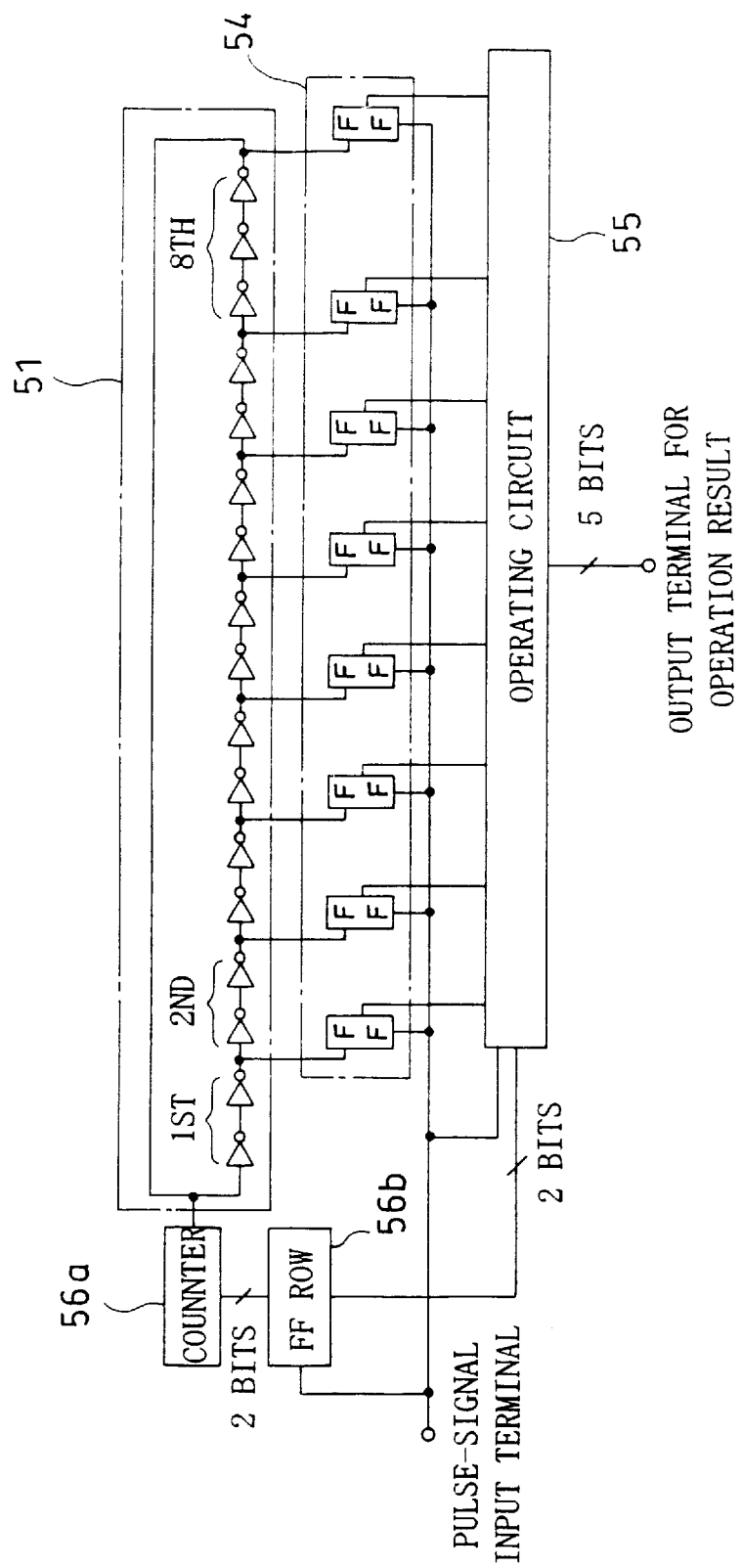
FIG. 21 shows the structure of a conventional time counting circuit.
Figure 22A:
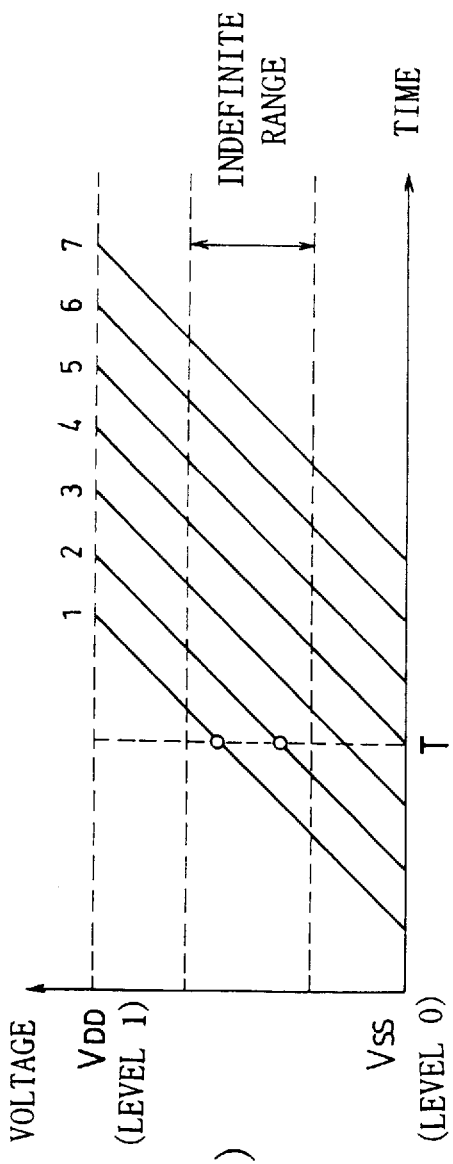
FIGS. 22A and 22B illustrate disadvantages of the conventional time counting circuit and showing the transitions of the output voltages from the respective delay circuits.
Figure 22B:
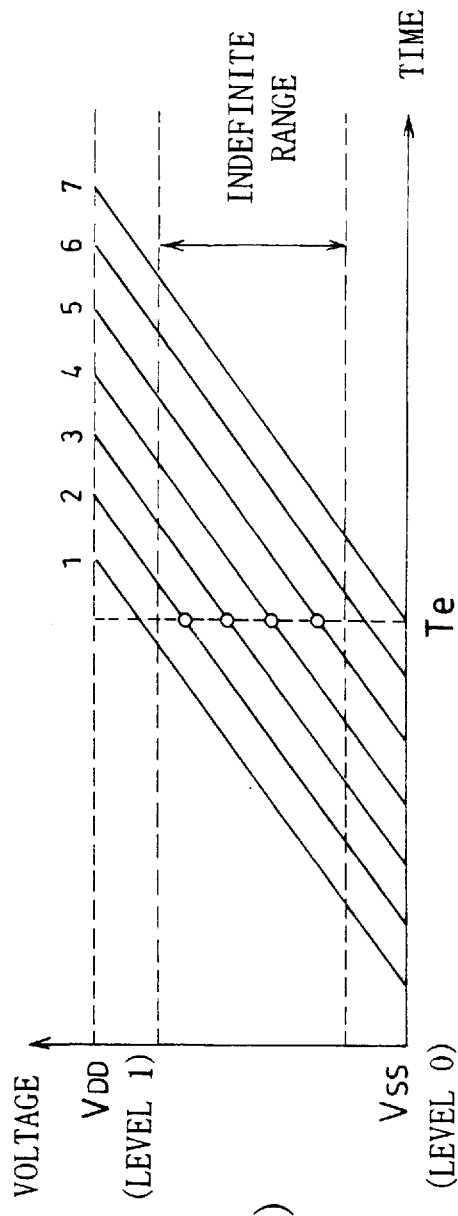
Figures 23A, 23B:
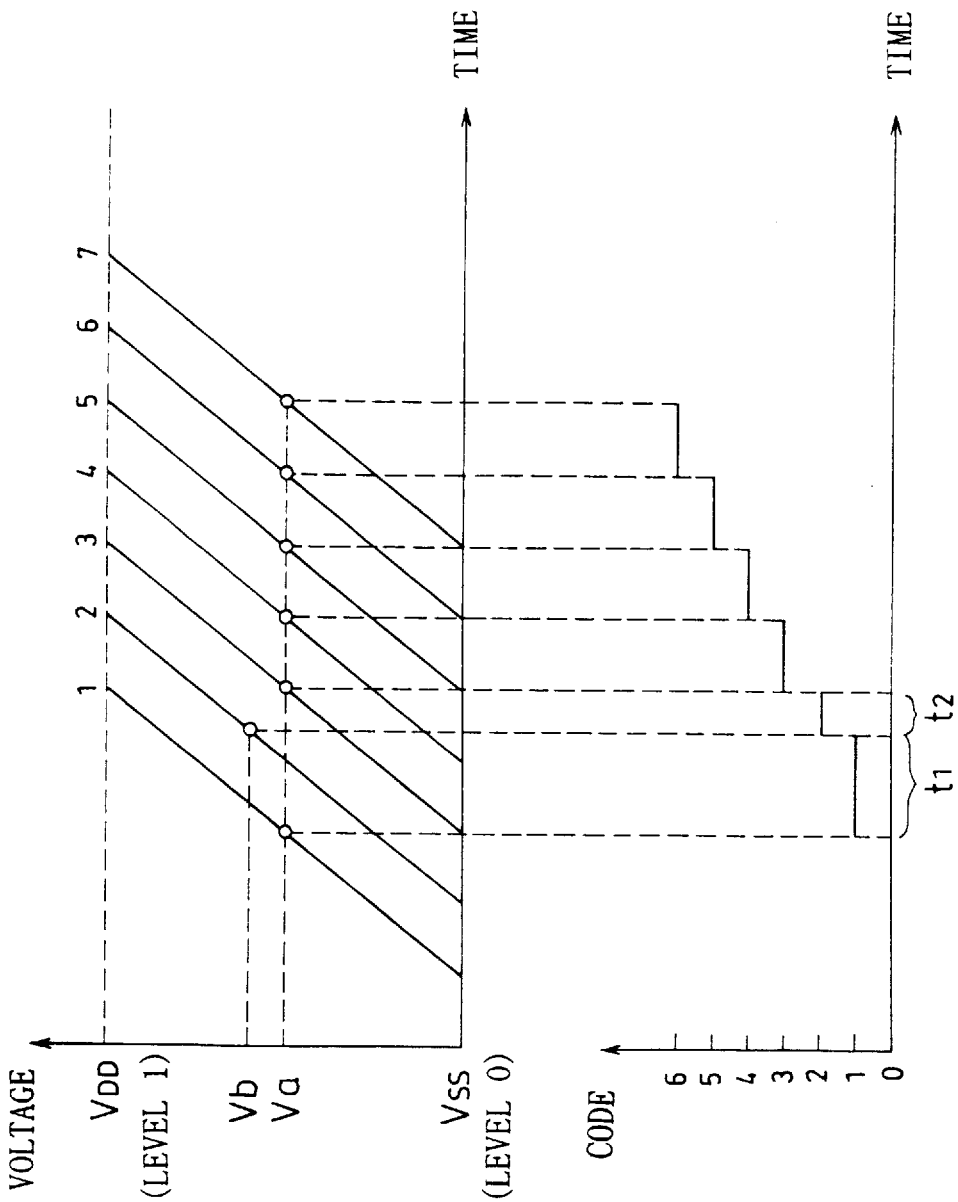
FIG. 23(a) is a graph showing the transitions of the output voltages from the respective delay circuits and FIG. 23(b) is a graph showing the time codes.

FIG. 20 is a timing chart showing the operation of the skew adjusting circuit 60 according to the present embodiment.

When the first clock pulse signal 61A outputted from the circuit A and delayed by the first delay circuit 61 rises (TIME tA), the first circuit of the second sampling circuit 64 holds and amplifies the potential N1 of the second clock pulse signal 61B outputted from the circuit B and delayed by the second delay circuit 62. On the other hand, when the second clock pulse signal 61B rises (TIME tB), the first circuit of the first sampling circuit 63 holds and amplifies the potential M1 of the first clock pulse signal 61A.

The first flip-flop 65 holds the output signal from the second circuit of the first sampling circuit 63 on the subsequent rising edge of the second clock pulse signal 61B at the time tB. Since the potential M1 is high, the data held in the first flip-flop 65 becomes "1". The second flip-flop 66 holds the output signal from the second circuit of the second sampling circuit 64 on the subsequent rising edge of the first clock pulse signal 61A at the time tA. Since the potential N1 is low, the data held in the second flip-flop 66 becomes "0".

Since the data held in the first flip-flop 65 is "1" and the data held in the second flip-flop 66 is "0", the 4-bit counter 96 of the operating circuit 69 adds 1 to the output data. As a result, the operating circuit 69 outputs the first control signal 69AD1 indicating a longer delay time to the first delay circuit 61. In response to the first control signal 69AD1, the first clock pulse signal 61A is further delayed to have an operational timing closer to that of the second clock pulse signal 61B.

By repeatedly performing the foregoing operation, a time difference between the first clock pulse signal 61A and the second clock pulse signal 61B is reduced to eliminate the problem of the clock skew.

Although the potentials of the first and second clock pulse signals 61A and 61B are sampled on the respective rising edges of the second and first clock pulse signals 61B and 61A in the present embodiment, they may be sampled on the respective falling edges of the second and first clock pulse signals 61B and 61A.

The function of the sampling circuit in the skew adjusting circuit according to the present embodiment can also be implemented by using a circuit other than the sampling circuit, similarly to the time counting circuit according to the first embodiment. For example, a folded cascode circuit as shown in FIG. 11(a) may be used in place of the sampling circuit.

We claim:

1. A time counting circuit for measuring a pulse spacing of a pulse signal, comprising:

a delay circuit ring comprising a plurality of delay circuits connected in a ring configuration around which a transition signal circulates;

converting means comprising a single converting circuit or a plurality of converting circuits receiving a delay circuit output signal from at least one of the delay circuits of said delay circuit ring, each converting circuit converting and outputting a converted output signal that corresponds to the delay circuit output signal received from the corresponding one of the delay circuits in accordance with an indication based on the time at which a pulse signal to be measured rises or falls; and an operating circuit for converting a logic level signal obtained based on the converted output signal outputted from said converting means to numeric data and calculating the pulse spacing of said pulse signal to be measured based on said numeric data, wherein the converting circuit of said converting means converts the delay circuit output signal from said delay circuit such that logic represented by the delay circuit output signal received from the delay circuit coincides with logic represented by the logic level signal obtained based on the converted output signal from the converting circuit.

2. A time counting circuit according to claim 1, further comprising:

a row of holding circuits comprising a single holding circuit or a plurality of holding circuits receiving the converted output signal from the corresponding converting circuit of said converting means, each holding circuit converting the converted output signal received from the converting circuit to a logic level signal in accordance with an indication based on the time at which the pulse signal to be measured rises or falls and outputting the logic level signal.

3. A time counting circuit according to claim 2, further comprising:

a switch-signal generating circuit for receiving the pulse signal to be measured and generating a first switch signal or a second switch signal based on the time at which said pulse signal to be measured rises or falls, wherein the converting circuit of said converting means converts and outputs the delay circuit output signal received from the delay circuit in accordance with an indication by the first switch signal generated from said switch signal generating circuit and each holding circuit of said row of holding circuits converts the converted output signal received from the converting circuit to a logic level signal in accordance with an indication by the second switch signal generated from said switch-signal generating circuit and outputs the logic level signal.

4. A time counting circuit according to claim 3, wherein said converting circuit is a sampling circuit for outputting a sampled signal at a constant potential when there is no indication by the first switch signal and sampling the delay circuit output signal generated from the delay circuit and received by said converting circuit when there is the indication by said first signal so as to amplify a differential voltage between a potential of the sampled signal and a given reference potential, to add the amplified differential voltage to said constant potential, and to output the sum of the amplified differential voltage and said constant potential.

5. A time counting circuit according to claim 4, wherein said sampling circuit generates the given reference potential.

6. A time counting circuit according to claim 4, wherein said sampling circuit comprises:

an external input terminal for receiving an outside signal;

a first circuit for receiving the outside signal from said external input terminal;

a second circuit for receiving a signal outputted from said first circuit;

a first switching means provided between said external input terminal and an input terminal of said first circuit, said first switching means being switched between a conductive state for connecting said external input terminal to the input terminal of said first circuit and a non-conductive state for disconnecting said external input terminal from the input terminal of said first circuit; and a second switching means provided between the input terminal of said first circuit and an output terminal of said second circuit, said second switching means being switched between a conductive state for connecting the input terminal of said first circuit to the output terminal of said second circuit and a non-conductive state for disconnecting the input terminal of said first circuit from the output terminal of said second circuit, wherein said first circuit comprises:

a first capacitance having one terminal connected to the input terminal of said first circuit;

a first inverting amplifier circuit having an input terminal and an output terminal for inverting and amplifying a voltage at another terminal of said first capacitance and outputting the inverted and amplified voltage to an output terminal of said first circuit; and a third switching means provided between input and output terminals of said first inverting amplifier circuit, said third switching means being switched between a conductive state for connecting the input terminal of said first inverting amplifier circuit to the output terminal thereof and a non-conductive state for disconnecting the input terminal of said first inverting amplifier circuit from the output terminal thereof and said second circuit comprises:

a second capacitance having one terminal connected to an input terminal of said second circuit;

a second inverting amplifier circuit having an input terminal and an output terminal for inverting and amplifying a voltage at another terminal of said second capacitance and outputting the inverted and amplified voltage to the output terminal of said second circuit; and a fourth switching means provided between input and output terminals of said second inverting amplifier circuit, said fourth switching means being switched between a conductive state for connecting the input terminal of said second inverting amplifier circuit to the output terminal thereof and a non-conductive state for disconnecting the input terminal of said second inverting amplifier circuit from the output terminal thereof, wherein when there is no indication by the first switch signal, said first and third switching means are in the conductive states, while said second and fourth switching means are in the non-conductive states, wherein when there is the indication by said first switch signal, said first and third switching means are temporarily brought into the non-conductive states, while said second and fourth switching means are brought into the conductive states, and then said first and third switching means are brought again into the conductive states, while said second and fourth switches are brought again into the non-conductive states.

7. A time counting circuit according to claim 3, wherein said converting circuit is a folded cascade circuit for:

(a) outputting a signal at a constant potential when there is no indication by said first switch signal; and (b) amplifying a differential voltage between a potential of the delay circuit output signal generated from the delay circuit and received by said converting circuit and a given reference potential when there is the indication by said first switch signal so as to add the amplified differential voltage to said constant potential and to output the sum of the amplified differential voltage and said constant potential.

8. A time counting circuit according to claim 1, further comprising:

a phase comparator for comparing a phase of the signal at an output terminal of one of the delay circuits of said delay circuit ring with a phase of a reference clock signal and outputting a direction signal indicating a phase correction; and a loop filter for outputting a control signal for controlling a signal delay time to at least one of the delay circuits of said delay circuit ring in response to the direction signal outputted from said phase comparator, said delay circuit ring, said phase comparator, and said loop filter composing a phase-locked loop (PLL).

* * * * *